(12) United States Patent
Song et al.

(10) Patent No.: US 8,796,662 B2
(45) Date of Patent: Aug. 5, 2014

(54) SEMICONDUCTOR DEVICES WITH VERTICAL STRUCTURE INCLUDING DATA STORAGE LAYER OR PATTERN

(75) Inventors: Seong-Ho Song, Suwon-si (KR); Chan-Jin Park, Yongin-si (KR); In-Gyu Baek, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 180 days.

(21) Appl. No.: 13/565,830

(22) Filed: Aug. 3, 2012

(65) Prior Publication Data

US 2013/0037774 A1     Feb. 14, 2013

(30) Foreign Application Priority Data

Aug. 10, 2011   (KR) .................. 10-2011-0079726

(51) Int. Cl.
*H01L 29/06* (2006.01)

(52) U.S. Cl.
USPC ...... 257/4; 257/5; 257/E45.002; 257/E45.003

(58) Field of Classification Search
CPC ....... H01L 45/04; H01L 45/06; H01L 45/146; H01L 27/24; H01L 27/2481
USPC ............................ 257/4, 5, E45.002, E45.003
See application file for complete search history.

(56) References Cited

U.S. PATENT DOCUMENTS

| | | | |
|---|---|---|---|
| 7,679,133 B2 | 3/2010 | Son et al. | |
| 7,700,935 B2 | 4/2010 | Kim et al. | |
| 7,800,091 B2 | 9/2010 | Kamigaichi et al. | |
| 8,525,247 B2 * | 9/2013 | Park et al. | 257/314 |
| 8,592,789 B2 * | 11/2013 | Sasago et al. | 257/2 |
| 8,634,257 B2 * | 1/2014 | Hanzawa et al. | 365/189.14 |
| 2010/0112769 A1 | 5/2010 | Son et al. | |
| 2013/0134377 A1 * | 5/2013 | Park et al. | 257/4 |

FOREIGN PATENT DOCUMENTS

| | | |
|---|---|---|
| JP | 2008135744 | 6/2008 |
| JP | 2008277543 | 11/2008 |
| JP | 2009117843 | 5/2009 |
| KR | 1020080048314 A | 6/2008 |
| KR | 1020090047614 A | 5/2009 |
| KR | 100994868 | 11/2010 |

\* cited by examiner

*Primary Examiner* — Minh-Loan T Tran
(74) *Attorney, Agent, or Firm* — Volentine & Whitt, PLLC

(57) ABSTRACT

A semiconductor device includes a first horizontal molding pattern, a horizontal electrode pattern disposed on the first horizontal molding pattern, and a second horizontal molding pattern disposed on the horizontal electrode pattern. A vertical structure extends through the horizontal patterns. The vertical structure includes a vertical electrode pattern, a data storage pattern interposed between the vertical electrode pattern and the horizontal patterns, a first buffer pattern interposed between the data storage pattern and the first molding pattern, and a second buffer pattern interposed between the data storage pattern and the second molding pattern and spaced apart from the first buffer pattern.

20 Claims, 18 Drawing Sheets

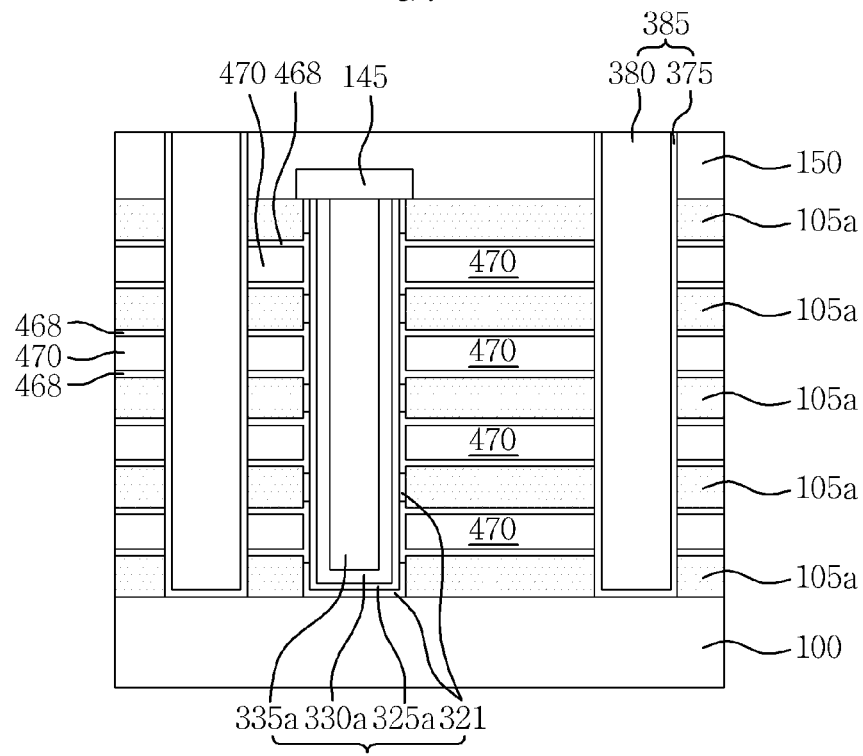
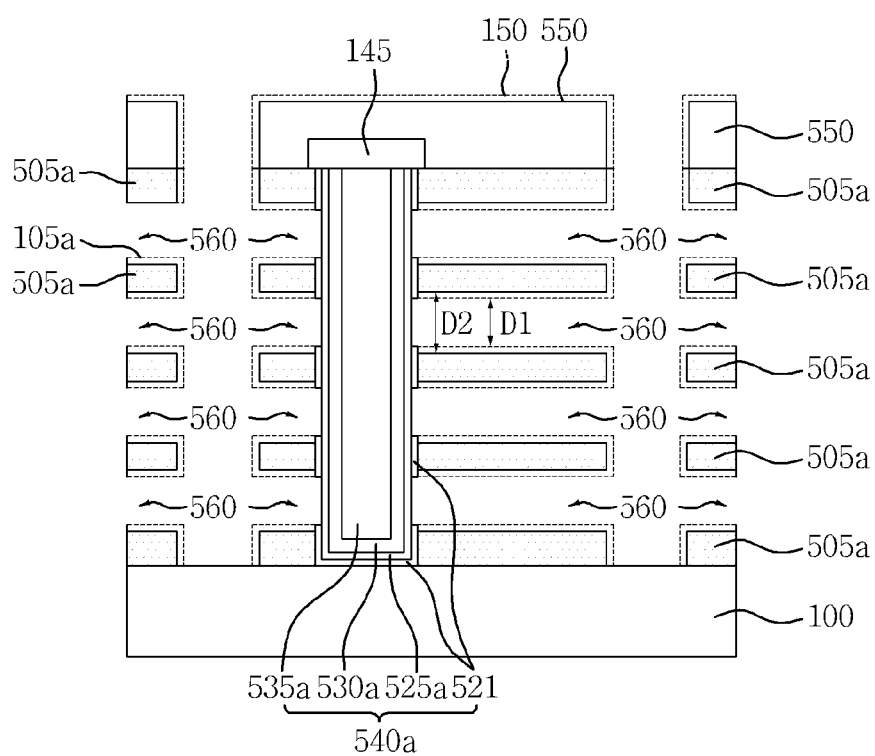

SEMICONDUCTOR DEVICES WITH VERTICAL STRUCTURE INCLUDING DATA STORAGE LAYER OR PATTERN

PRIORITY STATEMENT

This application claims priority under 35 U.S.C. §119 to Korean Patent Application No. 10-2011-0079726 filed on Aug. 10, 2011, the disclosure of which is hereby incorporated by reference in its entirety.

BACKGROUND

1. Field

The inventive concept relates to vertical or 3-dimensional semiconductor memory devices and to methods of fabricating the same. More particularly, the inventive concept relates to vertical random access memory (RAM) devices and to methods of fabricating the same.

2. Description of Related Art

Various methods of vertically forming a plurality of memory cells on a substrate have been developed to overcome limits of planar semiconductor memory devices in terms of the integration density that such planar devices can provide. One example of a semiconductor device having a plurality of vertically stacked memory cells is a vertical resistive random access memory (Re-RAM). A vertical Re-RAM has a stack of horizontal layers including horizontal electrode layers spaced one above the other on a substrate, and a vertical structure extending through the stack of horizontal layers. The vertical structure includes a vertical electrode layer and a data storage layer interposed between the vertical electrode layer and the stack of horizontal layers. The integrity of the data storage layer is crucial to the reliability and performance of the Re-RAM.

SUMMARY

According to one aspect of the inventive concept, there is provided a semiconductor device comprising a substrate having an upper surface, horizontal patterns stacked on the upper surface of the substrate and which include a first molding pattern, a horizontal electrode pattern disposed on the first molding pattern, and a second molding pattern disposed on the horizontal electrode pattern, and a vertical structure extending vertically through the horizontal patterns, and in which the vertical structure comprises, a vertical electrode pattern, a data storage pattern interposed between the vertical electrode pattern and the horizontal patterns, a first buffer pattern interposed between the data storage pattern and the first molding pattern, and a second buffer pattern interposed between the data storage pattern and the second molding pattern and spaced apart from the first buffer pattern.

According to another aspect of the inventive concept, there is provided a semiconductor device comprising a substrate having an upper surface, horizontal patterns stacked on the upper surface of the substrate and which include a first horizontal electrode pattern, a molding pattern disposed on the first horizontal electrode pattern, and a second horizontal electrode pattern disposed on the molding pattern, and a vertical structure extending vertically through the horizontal patterns and which comprises a vertical electrode pattern having a lateral surface, a data storage pattern interposed between the vertical electrode pattern and the horizontal patterns and extending along the lateral surface of the vertical electrode pattern, and a buffer pattern interposed between the data storage pattern and the molding pattern, and in which the buffer pattern is disposed at a level above the upper surface of the substrate different than the levels at which the first and second horizontal electrode patterns are disposed above the upper surface of the substrate.

According to still another aspect of the inventive concept, there is provided a semiconductor device, comprising a substrate having an upper surface, horizontal layers stacked on the upper surface of the substrate and which include horizontal electrode layers spaced one above the other on a substrate, and a vertical structure extending vertically through the horizontal layers, and in which the vertical structure comprises a vertical electrode, a data storage layer extending around the vertical electrode, and vertically spaced apart segments of a buffer layer interposed between the data storage layer and each of the horizontal electrode layers, respectively, wherein the segments of the buffer layer are of material comprising silicon oxide, insulating nitride or silicon oxynitride (SiON).

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters designate the same parts throughout the different views. In the drawings:

FIG. 8 is a cross-sectional view for illustrating another example of the second embodiment of a method of fabricating a semiconductor device according to the inventive concept;

FIGS. 9A and 9B are cross-sectional views for illustrating a third embodiment of a method of fabricating a semiconductor device according to the inventive concept;

DETAILED DESCRIPTION OF THE PREFERRED EMBODIMENTS

Figure 1A:
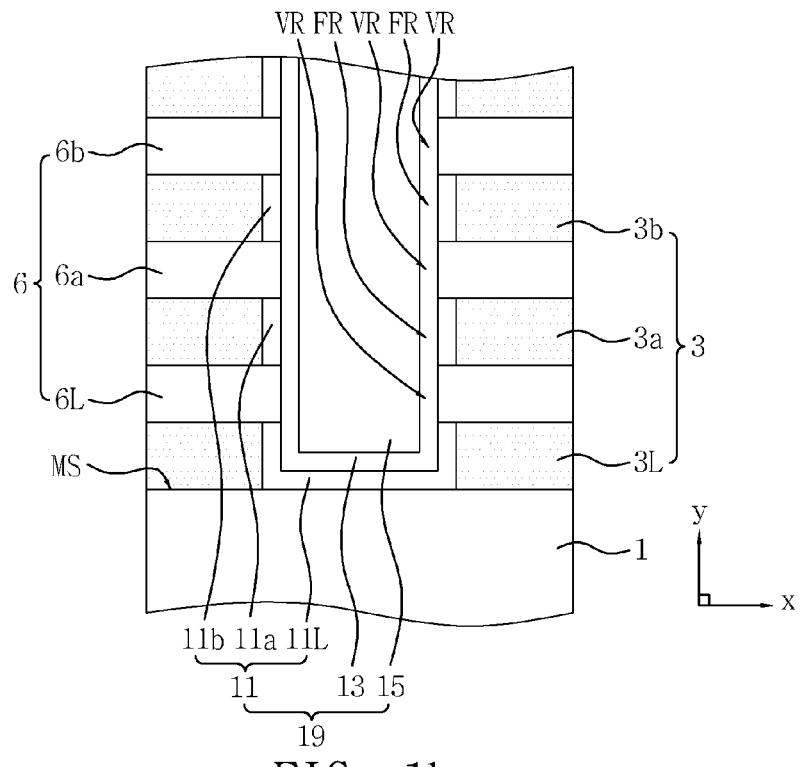
FIG. 1A is a cross-sectional view of a first embodiment of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, in some cases, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Furthermore, spatially relative terms, such as "upper", "top" or "bottom" are used to describe an element's and/or layer's relationship to another element(s) and/or layer(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "thickness" is generally used to describe the vertical dimension of a particular element or layer in the orientation shown in the drawings.

Examples of a first embodiment of a semiconductor device according to the inventive concept will now be described in detail with reference to FIGS. 1A, 1B and 1C.

In the example shown in FIG. 1A, the semiconductor device includes a semiconductor substrate 1. For example, the substrate 1 may be a silicon substrate, a germanium (Ge) substrate, or a silicon-germanium (SiGe) substrate. Or, the semiconductor substrate 1 may be a silicon-on-insulator (SOI) substrate.

Horizontal patterns 3 and 6 are alternately disposed one atop the other on the substrate 1, i.e., the semiconductor device includes a vertical stack of alternately disposed horizontal molding patterns 3 and electrode patterns 6. Accordingly, the electrode patterns 6 are vertically spaced apart from one another on the substrate 1 by the molding patterns 3.

In this respect, the term "vertical" refers to a direction orthogonal to a major surface MS of the substrate 1, and the term "horizontal" refers to an orientation parallel to the major surface MS of the substrate 1. Thus, each of the horizontal patterns 3 and 6 extends in its lengthwise and widthwise directions parallel to the main surface MS of the substrate 1, and the horizontal patterns 3 and 6 appear as stacked one atop the other on the substrate 1 in a direction perpendicular to the main surface MS of the substrate 1. Referring specifically to FIG. 1 in this respect, each of the patterns 3 and 6 is oriented or lies generally parallel to the direction of the X-axis, and the patterns 3 and 6 are stacked vertically in the direction of the Y-axis.

Furthermore, the molding patterns 3 are of a first insulating material. For example, the molding patterns 3 may be of silicon oxide. The molding patterns 3 may include a lower molding pattern 3L, a first molding pattern 3a disposed on the lower molding pattern 3L, and a second molding pattern 3b disposed on the first molding pattern 3b.

On the other hand, the horizontal electrode patterns 6 are of a first conductive material. For example, the horizontal electrode patterns 6 may include at least one material selected from the group consisting of doped silicon, metals, metal nitrides, and metal-semiconductor compounds. Specific examples of these materials include doped polysilicon (poly-Si), ruthenium (Ru), tungsten (W), tungsten nitride (WN), titanium (Ti), titanium nitride (TiN), titanium aluminum nitride (TiAlN), titanium silicide (TiSi), titanium silicon nitride (TiSiN), tantalum (Ta), tantalum nitride (TaN), hafnium (Hf), and zirconium (Zr). The electrode patterns 6 may include a lower horizontal electrode pattern 6L, a first horizontal electrode pattern 6a disposed on the lower horizontal electrode pattern 6L, and a second horizontal electrode pattern 6b disposed on the first horizontal electrode pattern 6a.

In this example, in the stack of horizontal patterns 3 and 6, the uppermost pattern is one of the molding patterns 3, and the lowermost pattern is the lowermost molding pattern 3L. Thus, each of the horizontal electrode patterns 6 is interposed between a respective pair of the molding patterns 3. Also, the lower molding pattern 3L may be interposed directly between the lower horizontal electrode pattern 6b and the substrate 1. Thus, the lower horizontal electrode pattern 6L, which is the lowermost one of the horizontal electrode patterns 6, is spaced apart from the substrate 1.

The semiconductor device also has a vertical structure 19 extending through the stack of horizontal patterns 3 and 6. The vertical structure 19 in this example includes a plurality of buffer patterns 11 (segments of a buffer layer), a data storage layer 13 (which may be referred to hereinafter as data storage pattern 13 due to the way in which it is fabricated as described later on), and a vertical electrode 15 (which may be referred to hereinafter as vertical electrode pattern 15 for similar reasons).

The vertical electrode pattern 15 may comprise material selected from the group consisting of Ru, W, WN, Ti, TiN, TiAlN, TiSi, TiSiN, Ta, TaN, Hf, and Zr or poly-Si. Also, the vertical electrode pattern 15 extends through at least all of the horizontal electrode patterns 6 of the stack. In this regard, the vertical electrode pattern 15 is in the form of a pillar.

The data storage pattern 13 is interposed between the vertical electrode pattern 15 and the horizontal patterns 3 and 6. The data storage pattern 13 may also extend between the vertical electrode pattern 15 and the substrate 1. In other words, portions of the data storage pattern 13 are interposed between the vertical electrode pattern 15 and the horizontal patterns 3 and 6, and a portion of the data storage pattern 13 covers the bottom of the vertical electrode pattern 15.

The buffer patterns 11 are interposed between the data storage pattern 13 and the molding patterns 3. To this end, the buffer patterns 11 include a lower buffer pattern 11L, a first buffer pattern 11a, and a second buffer pattern 11b spaced apart from one another vertically. The lower buffer pattern 11L has a first portion covering the bottom of the data storage pattern 13 so as to be interposed between the data storage pattern 13 and the substrate 1, and a second portion extending from the first portion of the lower buffer pattern 11L and covering a portion of a lateral surface of the data storage pattern 13. The first buffer pattern 11a is interposed between the first molding pattern 3a and the data storage pattern 13. The second buffer pattern 11b is interposed between the second molding pattern 3b and the data storage pattern 13.

In some cases, the buffer patterns 11 and the molding patterns 3 are of the same insulating material. For example, the buffer patterns 11 and the molding patterns 3 may be formed of silicon oxide. In other cases, the buffer patterns 11 are of material having an etch selectivity with respect to the material of the molding patterns 3. For example, the molding patterns 3 and the buffer patterns 11 may be of respective insulating oxides having an etch selectivity with respect to each other. For instance, the molding patterns 3 may be of a high-density plasma (HDP) oxide and/or a high-temperature oxide (HTO), and the buffer patterns 11 may be of an atomic layer deposition (ALD) oxide having an etch selectivity with respect to the HDP oxide and/or HTO. As another example, the molding patterns 3 may be formed of an insulating oxide (e.g., silicon oxide), and the buffer patterns 11 may be formed of an insulating nitride (e.g., silicon nitride, aluminum nitride, or hafnium nitride). As still another example, the molding patterns 3 may be formed of silicon oxide, while the buffer patterns 11 may be formed of silicon oxynitride (SiON).

The data storage pattern 13 may comprise variable resistance material. For example, the data storage pattern 13 may comprises a transition metal oxide (TMO), such as titanium oxide (TiO), tantalum oxide (TaO), nickel oxide (NiO), zirconium oxide (ZrO), or hafnium oxide (HfO). Alternatively, the data storage pattern 13 may comprise data storage material, such as phase-change material. The phase-change material may be of at least one material selected from the group consisting of tellurium (Te), selenium (Se), Ge, antimony (Sb), bismuth (Bi), lead (Pb), tin (Sn), silver (Ag), arsenic (As), sulfur (S), silicon (Si), phosphorus (P), oxygen (O), and carbon (C). For example, the phase-change material may be a chalcogenide, such as GeSbTe (GST).

In the present embodiment, the data storage pattern 13 has a plurality of variable resistance regions VR and a plurality of fixed resistance regions FR. The variable resistance regions VR are regions of the data storage pattern 13 which are interposed between the horizontal electrode patterns 6 and the vertical electrode pattern 15, while the fixed resistance regions FR are regions of the data storage pattern 13 which are interposed between the buffer patterns 11 and the vertical electrode pattern 15. Thus, the variable resistance regions VR include a first variable resistance region interposed between the first horizontal electrode pattern 6a and the vertical electrode pattern 15 and a second variable resistance region interposed between the second horizontal electrode pattern 6b and the vertical electrode pattern 15, and the fixed resistance regions FR include a first fixed resistance region interposed between the first buffer pattern 11a and the vertical electrode pattern 15 and a second fixed resistance region interposed between the second buffer pattern 11b and the vertical electrode pattern 15. Also, each of the variable resistance regions VR is provided between the fixed resistance regions FR of a respective pair thereof.

The variable resistance regions VR of the data storage pattern 13 have a relatively high resistance or a relatively low resistance depending on the electronic signal applied thereto. On the other hand, the resistance of the fixed resistance regions FR of the data storage pattern 13 remains constant resistance irrespective of the operation of the device. Specifically, the fixed resistance regions FR may always remain in a state of relatively high resistance. In this example, the resistances of the fixed resistance regions FR remain higher than those of the variable resistance regions VR so that the fixed resistance regions FR function as insulators between the variable resistance regions VR.

When the data storage pattern 13 includes a TMO, the variable resistance regions VR of the data storage pattern 13 have a relatively high resistance in a reset state. When a write current is supplied to the variable resistance regions VR of the data storage pattern 13, a current flow path is generated in the variable resistance regions VR of the data storage pattern 13 so that the variable resistance regions VR can have a relatively low resistance. When a read current lower than the write current is supplied to the variable resistance regions VR of the data storage pattern 13, the data storage pattern 13 continuously have a relatively low resistance. When a reset current higher than the write current is supplied to the variable resistance regions VR of the data storage pattern 13, the variable resistance regions VR of the data storage pattern 13 have a relatively high resistance.

The aforementioned other examples of the first embodiment of the semiconductor device according to the inventive concept will now be described with reference to FIGS. 1B and 1C, respectively. In this regard, primarily only the differences between the example shown in FIG. 1A and the examples shown in FIGS. 1B and 1C, respectively, will be described in detail.

Figure 1B:
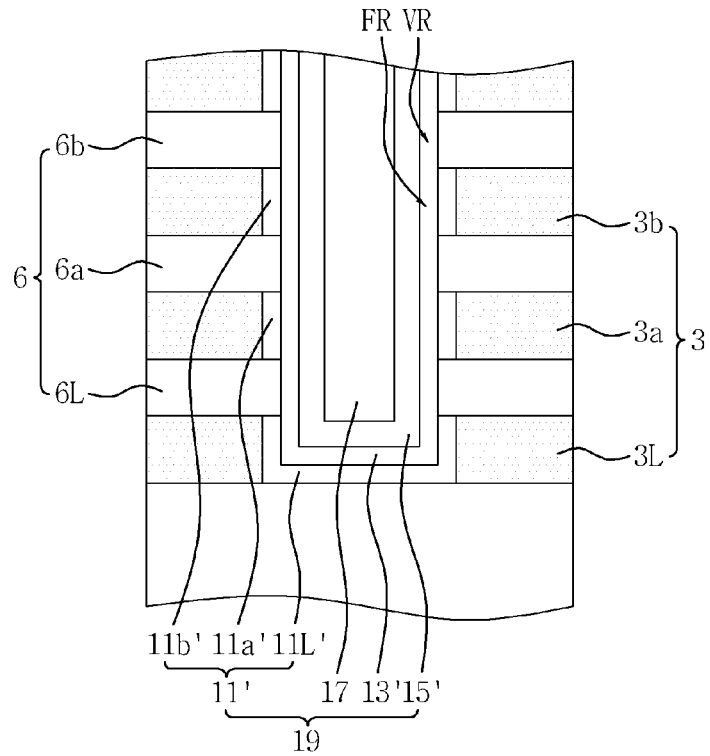
FIG. 1B is a cross-sectional of another example of the first embodiment of a semiconductor device according to the inventive concept.

Referring to FIG. 1B, vertical structure 19 includes a plurality of buffer patterns 11', a data storage pattern 13', a vertical electrode pattern 15', and a core pattern 17. The buffer patterns 11' include a lower buffer pattern 11L', a first buffer pattern 11a', and a second buffer pattern 11b'. The buffer patterns 11' and the data storage pattern 13' are substantially the same as the buffer patterns 11 and the data storage pattern 13 described with reference to FIG. 1A.

The core pattern 17 is in the form of a pillar. The vertical electrode pattern 15' is a layer of conductive material interposed between the core pattern 17 and the data storage pattern 13'. In some cases, the core pattern 17 is of insulating material. For example, the core pattern 17 may be formed of silicon oxide. In other cases, the core pattern 17 is of conductive material such as a layer of metal (e.g., a W layer, a Ti layer, or a Ta layer) and/or a metal nitride layer (e.g., a WN layer, a TiN layer, or a TaN layer).

Figure 1C:
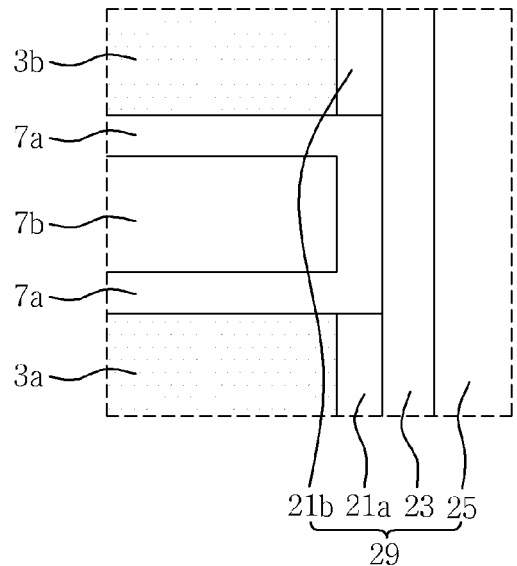
FIG. 1C is a cross-sectional view of still another example of the first embodiment of a semiconductor device according to the inventive concept.

Referring to FIG. 1C, instead of horizontal electrode patterns 6 shown in and described with reference to FIG. 1A, the stack of horizontal patterns has horizontal electrode patterns 7b alternately disposed with the molding patterns 3. The semiconductor device also includes first and second buffer patterns 21a and 21b which are substantially the same as the first and second buffer patterns 11a and 11b shown in and described with reference to FIG. 1A, a data storage pattern 23 which is substantially the same as the data storage pattern 13 shown in and described with reference to FIG. 1A, and a vertical electrode pattern 25 which is substantially the same as the vertical electrode pattern 15 shown in and described with reference to FIG. 1A. Accordingly, the device has a vertical structure 29 substantially the same as the vertical structure 19 shown in and described with reference to FIG. 1A.

The example shown in FIG. 1C also includes additional patterns 7a each of which extends contiguously along a lateral surface of a respective horizontal electrode pattern 7b (the surface adjacent to the data storage pattern 23), as well as along the top and bottom surface of the horizontal electrode pattern 7b. Thus, the additional pattern 7a is interposed between the horizontal electrode pattern 7b and the data storage pattern 23, between the horizontal electrode pattern 7b and one molding pattern of a vertically adjacent pair thereof (the first molding pattern 3a in the portion shown in the figure, and between the horizontal electrode pattern 7b and the other molding pattern 3 of the vertically adjacent pair (the second molding pattern 3b in the figure).

In some cases, the additional pattern 7a may be a layer of conductive material. For example, the additional pattern 7a may include be a metal layer, a metal nitride layer, or a layer of a metal-semiconductor compound. In other cases, the additional pattern 7a is a layer of dielectric material. For example, the additional pattern 7a may be a layer of a metal oxide (e.g., TiO, NiO, HfO, aluminum oxide (AlO), ZrO, ZnO, TaO, niobium oxide (NbO) or WO).

Examples of a second embodiment of a semiconductor device according to the inventive concept will now be described in detail with reference to FIG. 2A, FIG. 2B and FIG. 2C. Again, except as otherwise noted, the structure, aspects, materials, etc. of features of these examples are substantially the same as those described with respect to the first embodiment.

Figure 2A:
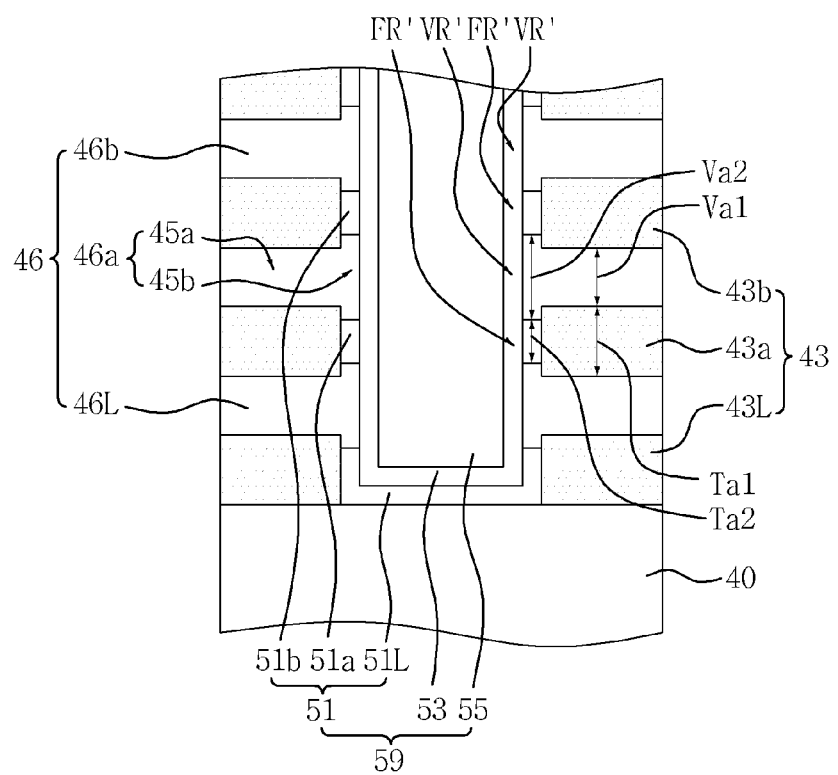
FIG. 2A is a cross-sectional view of a second embodiment of a semiconductor device according to the inventive concept.

In the example shown in FIG. 2A, horizontal molding patterns 43 and horizontal electrode patterns 46 are alternately disposed one atop the other on semiconductor substrate 40. The molding patterns 43 include a lower molding pattern 43L, a first molding pattern 43a disposed on the lower molding pattern 43L, and a second molding pattern 43b disposed on the first molding pattern 43b. The horizontal electrode patterns 46 include a lower horizontal electrode pattern 46L, a first horizontal electrode pattern 46a disposed on the lower horizontal electrode pattern 46L, and a second horizontal electrode pattern 46b disposed on the first horizontal electrode pattern 46a.

A vertical structure 59 extends through the stack of the horizontal patterns 43 and 46. The vertical structure 59 includes a plurality of buffer patterns 51, a data storage pattern 53, and a vertical electrode pattern 55.

The data storage pattern 53 includes variable resistance regions VR' and fixed resistance regions FR'. The variable resistance regions VR' are regions of the data storage pattern 53 interposed between horizontal electrode patterns 46 and the vertical electrode pattern 55, while the fixed resistance regions FR' are regions of the data storage pattern 53 interposed between the buffer patterns 51 and the vertical electrode pattern 55. The buffer patterns 51 are interposed between the data storage pattern 53 and the molding patterns 43. The buffer patterns 51 include a lower buffer pattern 51L, a first buffer pattern 51a, and a second buffer pattern 51b.

Each of the buffer patterns 51 is thinner than the molding pattern 43 disposed adjacent thereto, i.e., each of the buffer patterns 51a interposed between the data storage pattern 53 and a molding pattern 43 has a vertical dimension that is smaller than that of the molding pattern. Thus, as shown in the figure, for example, the thickness Ta2 of the first buffer pattern 51a is less than the thickness Ta1 of the first molding pattern 43a. Furthermore, the top surface of the first buffer pattern 51a is disposed at a level lower than that of the top surface of the adjacent first molding pattern 43a adjacent thereto, while the bottom surface of the first buffer pattern 51b is disposed at a level higher than that of the bottom surface of the first molding pattern 43a. The same holds true for the second buffer pattern 51b and the second molding pattern 43b disposed adjacent thereto.

Each of the horizontal electrode patterns 46 has a first portion and a second portion. The first portion 45a is interposed between vertically adjacent ones of the molding patterns 43, while the second portion 45b is interposed between vertically adjacent ones of the buffer patterns 51a, 51b, and 51L. The thickness Va1 of the first portion 45a of the first horizontal electrode pattern 46a is smaller than the thickness Va2 of the second portion 45b thereof. That is, the first portion 45a of the first horizontal electrode pattern 46a is thinner than the second portion 45b thereof.

Figure 2B:
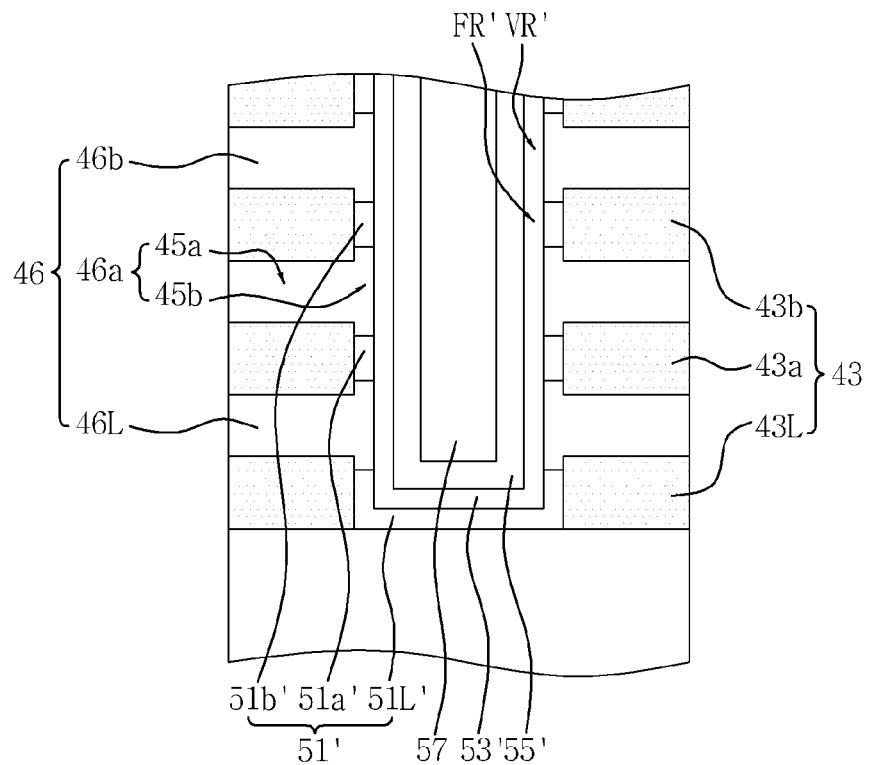
FIG. 2B is a cross-sectional view of another example of the second embodiment of a semiconductor device according to the inventive concept.
Figure 2C:
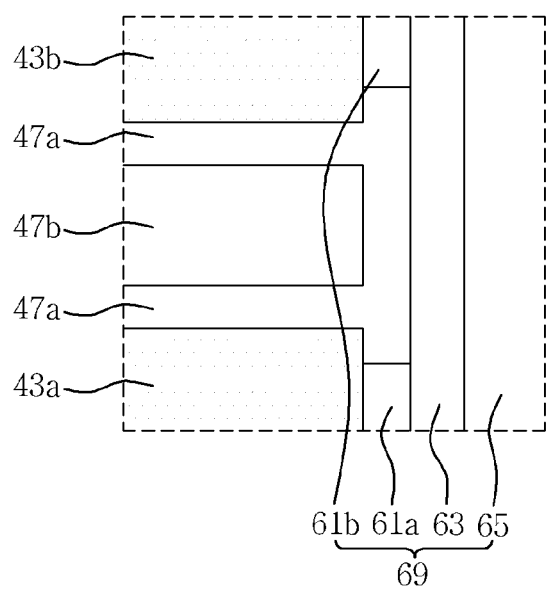
FIG. 2C is a cross-sectional view of still another example of the second embodiment of a semiconductor device according to the inventive concept.

In the example shown in FIG. 2B, the vertical structure 59' that extends through the stack of alternately disposed horizontal patterns 43 and 46 includes a plurality of buffer patterns 51', a data storage pattern 53', a vertical electrode pattern 55', and a core pattern 57 in the form of a pillar. The core pattern 57 is like the core pattern 17 described with reference to the example of FIG. 1B. Thus, the core pattern 57 may be of insulating material or conductive material.

In the example shown in FIG. 2C, first and second buffer patterns 61a and 61b, which are substantially the same as the first and second buffer patterns 51a and 51b described with reference to FIG. 2A. Furthermore, a data storage pattern 63 and a vertical electrode pattern 65 are substantially the same as the data storage pattern 53 and the vertical electrode pattern 55 described with reference to FIG. 2A. Accordingly, a vertical structure 69 including the buffer patterns 61a and 61b, the data storage pattern 63, and the vertical electrode pattern 65 is substantially the same as each the vertical structure 59 shown in and described with reference to FIG. 2A.

However, in this example, the stack of horizontal patterns includes horizontal electrode pattern 47b interposed between vertically adjacent ones of the molding patterns, and a respective additional pattern 47a extending contiguously along a lateral surface, top surface, and bottom surface of each horizontal electrode pattern 47b with the lateral surface of the horizontal electrode pattern 47b being that surface which is adjacent to the data storage pattern 63. Furthermore, portions of each additional pattern 47a project between the molding layers adjacent thereto and the data storage pattern 63, respectively. Otherwise, the additional pattern 47a is substantially the same as the additional pattern 7a described with reference to FIG. 1C.

Examples of a third embodiment of a semiconductor device according to the inventive concept will now be described with reference to FIG. 3A FIG. 3B and FIG. 3C. Again, except as otherwise noted or apparent, the structure, aspects, materials, etc. of features of these examples are substantially the same as those of the corresponding features described with respect to the first embodiment.

Figure 3A:
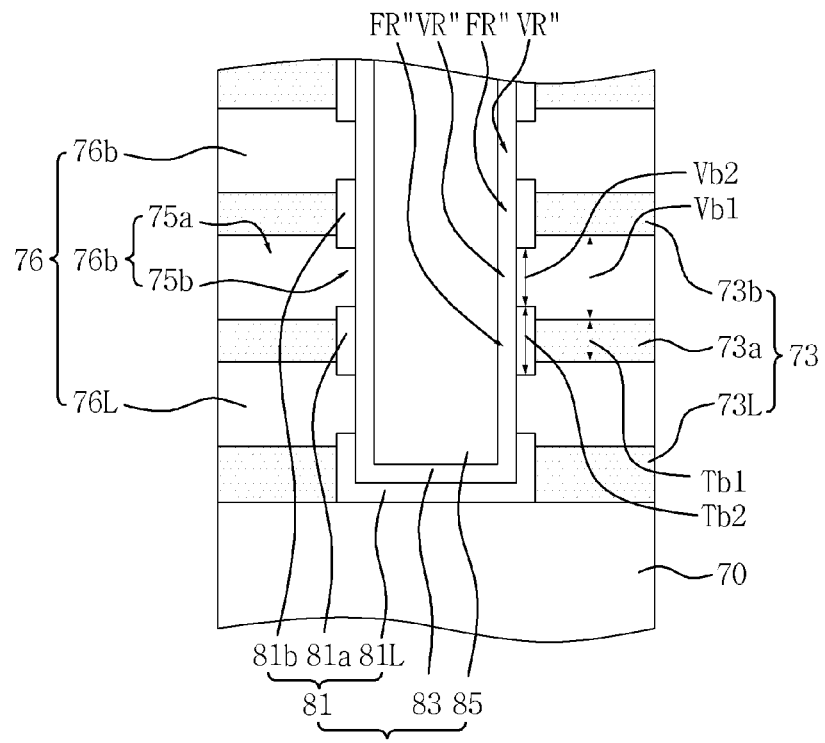
FIG. 3A is a cross-sectional view of a third embodiment of a semiconductor device according to the inventive concept.

In the example shown in FIG. 3A, horizontal molding and electrode patterns 73 and 76 are alternately disposed one atop the other on a semiconductor substrate 70. The molding patterns 73 include a lower molding pattern 73L, a first molding pattern 73a disposed on the lower molding pattern 73L, and a second molding pattern 73b disposed on the first molding pattern 73b. The horizontal electrode patterns 76 include a lower horizontal electrode pattern 76L, a first horizontal electrode pattern 76a disposed on the lower horizontal electrode pattern 76L, and a second horizontal electrode pattern 76b disposed on the first horizontal electrode pattern 76a.

A vertical structure 89 extends vertically through the stack of horizontal patterns 73 and 76. The vertical structure 89 includes a plurality of buffer patterns 81, a data storage pattern 83, and a vertical electrode pattern 85.

The data storage pattern 83 has variable resistance regions VR" and fixed resistance regions FR". The variable resistance regions VR" are regions of the data storage pattern 83 interposed between the horizontal electrode pattern 76 and the vertical electrode pattern 85, while the fixed resistance regions FR" are regions of the data storage patterns 83 interposed between the buffer patterns 81 and the vertical electrode pattern 85.

The buffer patterns 81 include a lower buffer pattern 81L, a first buffer pattern 81a, and a second buffer pattern 81b.

Each of the buffer patterns 81 is thicker than a molding pattern disposed adjacent thereto. For example, the thickness Tb2 of the first buffer pattern 81a is greater than the thickness Tb1 of the first molding pattern 73a adjacent thereto. Furthermore, the top surface of the first buffer pattern 81a is disposed at a level higher than that of the top surface of the first molding pattern 73a, while the bottom surface of the first buffer pattern 81b is disposed at a level lower than that of the bottom surface of the first molding pattern 73a.

Each of the horizontal electrode patterns 76 has a first portion 75a interposed between vertically adjacent ones of the molding patterns 73, and a second portion 75b interposed between vertically adjacent ones of the buffer patterns 81. The thickness Vb1 of the first portion 75a of the first horizontal electrode pattern 76a is greater than the thickness Vb2 of the second portion 75b of the first horizontal electrode pattern 76a. Accordingly, a phase-change memory device, for example, configured as shown in and described with reference to FIG. 3A offers improved performance. Specifically, an interface between the second portion 75b of the first horizontal electrode pattern 76a and the variable resistance region VR" is minimized, thereby lowering the reset current that must be applied during a reset operation of heating a phase-change material to its melting point or above.

Also, interfacial resistance is minimal because the second portion 75b of the first horizontal electrode pattern 76a is relatively thin. Therefore, in a 3-dimensional phase-change memory device having vertically arranged memory cells as shown in and described with reference to FIG. 3A, and in which the horizontal electrode patterns 76 are used as word lines, the necessary reset current is relatively low.

Figure 3B:
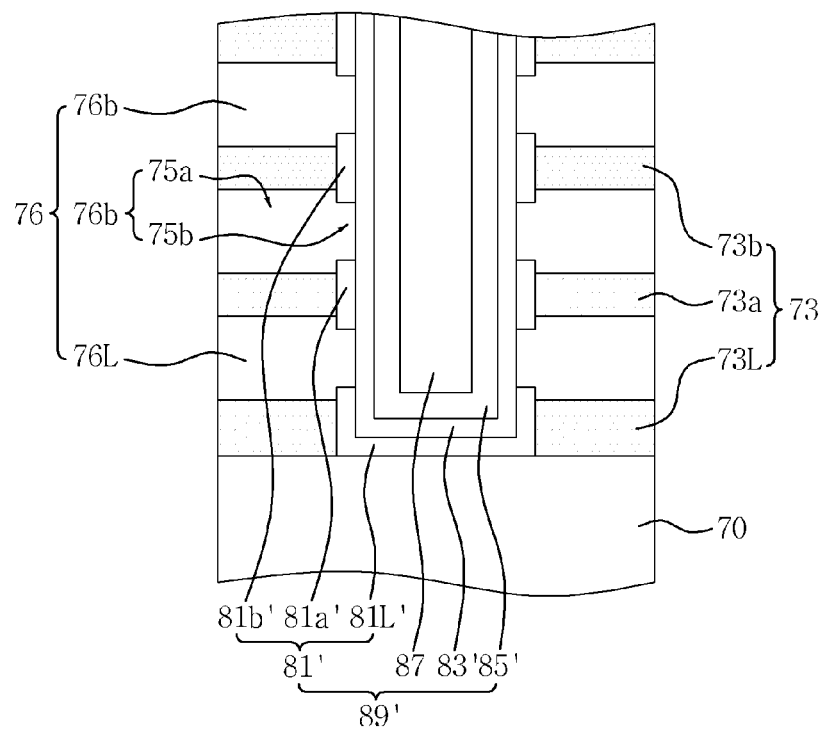
FIG. 3B is a cross-sectional view of another example of the third embodiment of a semiconductor device according to the inventive concept.
Figure 3C:
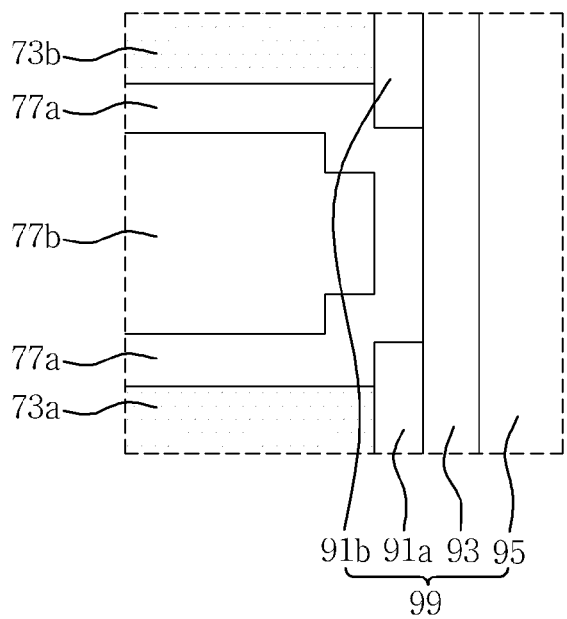
FIG. 3C is a cross-sectional view of still another example of the third embodiment of a semiconductor device according to the inventive concept.

In the example shown in FIG. 3B, the vertical structure 89' that extends vertically through the stack of horizontal patterns 73 and 76 includes a plurality of buffer patterns 81', a data storage pattern 83', a vertical electrode pattern 85', and a core pattern 87. The buffer patterns 81' and the data storage pattern 83' are substantially the same as the buffer patterns 81 and the data storage pattern 83 described with reference to FIG. 3A. The core pattern 87 is in the form of a pillar. Accordingly, the vertical structure 89' is substantially the same as the vertical structure 19' described with reference to FIG. 1B.

In the example shown in FIG. 3C, first and second buffer patterns 91a and 91b, are substantially the same as the first and second buffer patterns 81a and 81b described with reference to FIG. 3A. In addition, a data storage pattern 93 and a vertical electrode pattern 95, are substantially the same as the data storage pattern 83 and the vertical electrode pattern 85 described with reference to FIG. 3A. Thus, a vertical structure 99 that extends vertically through the stack of horizontal patterns is substantially the same as the vertical structure 89 shown in FIG. 3A.

On the other hand, horizontal electrode patterns 77b are interposed between vertically adjacent ones of the molding patterns. Also, a respective additional pattern 77a extends along the lateral surface, top surface and bottom surface of each horizontal electrode pattern 77b, with the lateral surface being that surface of the horizontal electrode pattern 77b that is adjacent to the data storage pattern 93. The horizontal electrode pattern 77b and the additional pattern 77a are thus substantially the same as the horizontal electrode pattern 7b and the additional layer 7a, respectively, described with reference to FIG. 1C, with the exception being that portions of the additional pattern 77a form corners into which respective ones of the buffer patterns fit.

Methods of fabricating semiconductor devices according to the inventive concept will now be described with reference to FIGS. 4 through 10.

Figure 5A:
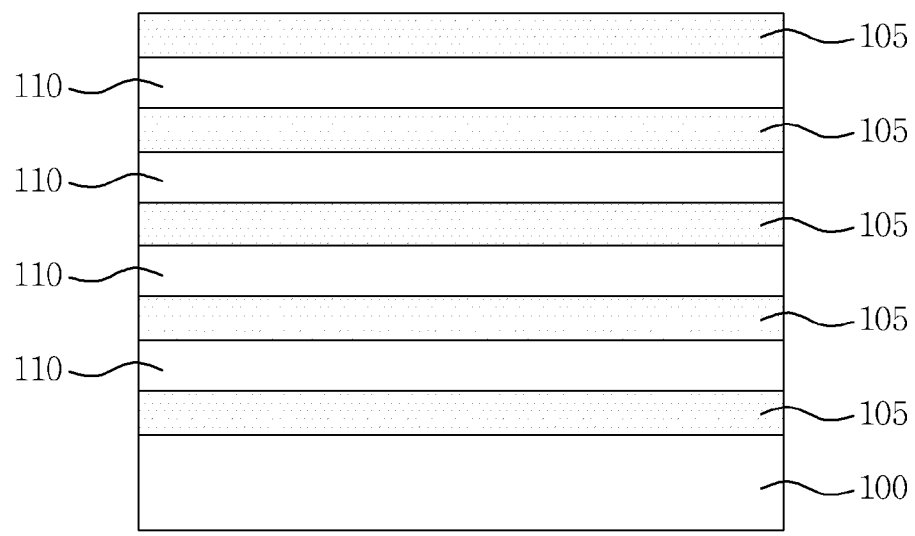
FIGS. 5A through 5L are cross-sectional views illustrating a first embodiment of a method of fabricating a semiconductor device according to the inventive concept.

Referring to FIG. 5A, a semiconductor substrate 100 is provided. The substrate 100 has a memory cell region (or cell array region) where memory cells are formed and a peripheral circuit region where peripheral circuits configured to operate the memory cells are formed.

Horizontal molding layers 105 and sacrificial layers 110 are alternately and repeatedly formed on the substrate 100. In this respect, first, a molding layer 105 is formed so that the lowermost layer of the stack of horizontal layers 105 and 110 is a molding layer 105, whereas the last of the horizontal layers formed is also a molding layer 105 so that the uppermost layer of the stack of horizontal layers 105 and 110 is also a molding layer 105.

The sacrificial layers 110 are formed of material having an etch selectivity with respect to the molding layers 105. For instance, each of the molding layers 105 may be formed of an insulating oxide (e.g., silicon oxide formed by a chemical vapor deposition (CVD) process), while each of the sacrificial layers 110 may be formed silicon nitride or silicon oxynitride (SiON). Alternatively, the sacrificial layers 110 may be formed of a silicon-based material having an etch selectivity with respect to silicon oxide.

Figure 5B:
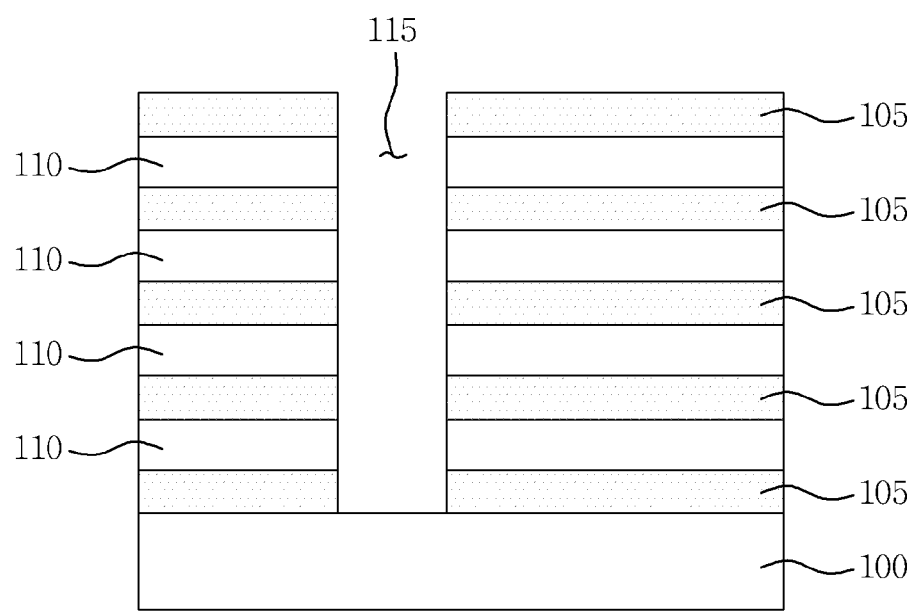

Referring to FIG. 5B, the molding layers 105 and the sacrificial layers 110 are patterned to thereby form at least one hole or vertical opening 115 in the stack of molding and sacrificial layers 105 and 110. The opening 115 may expose a predetermined region of the substrate 100. Practically speaking, a plurality of the openings 115 are formed in a 2-dimensional array, i.e., rows and columns of the openings 115 are formed.

Figure 5C:
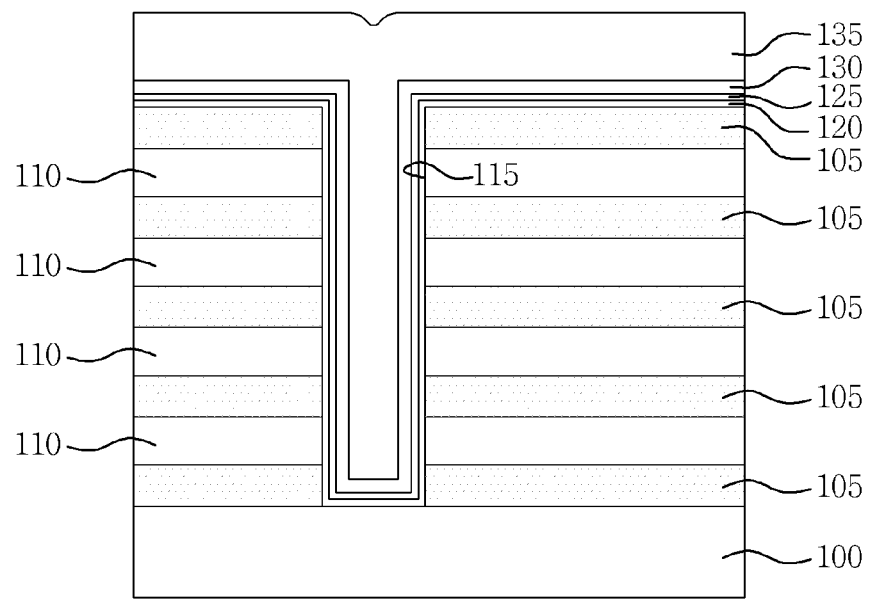

Referring to FIG. 5C, a buffer layer 120, a data storage layer 125, an electrode layer 130, and a core layer 135 are then sequentially formed on the substrate 100.

In this stage of the process, the buffer layer 120 is formed to a substantially uniform thickness along the sides and the bottom of the opening 115 and over the top surface of the stack of horizontal layers 105 and 110. That is, the buffer layer 120 may be conformally formed to a substantially uniform thickness along the inside of the opening 115 and over the top surface of the uppermost one of the molding and sacrificial layers 105 and 110.

The data storage layer 125 may have a substantially uniform thickness and cover the buffer layer 120. The electrode layer 130 may be formed on the data storage layer 125 to such a thickness as to leave part of the opening 115 unfilled. The core layer 135 is formed on the electrode layer 130 to fill the remaining portion of the opening 115 and cover the electrode layer 130.

According to an aspect of the inventive concept, the buffer layer 120 is formed of material having an etch selectivity with respect to the sacrificial layers 110. For example, when the sacrificial layers 110 are of a nitride, the buffer layer 120 can be a silicon oxide layer. In another example, when the sacrificial layers 110 are silicon layers, the buffer layer 120 can be a silicon oxynitride (SiON) layer, a silicon nitride layer, or a silicon oxide layer. Also, the buffer layer 120 may be formed of material having an etch selectivity with respect to the data storage layer 125.

Still further, the buffer layer 120 may be formed of the same material (e.g., silicon oxide) as the molding layers 105. Alternatively, in another example of this method, the buffer layer 120 is formed of material having an etch selectivity with respect to the material of the molding layers 105. For example, each of the molding layers 105 may be formed of one type of silicon oxide (e.g., an HDP oxide and/or an HTO), while the buffer layer 120 is formed of another type of silicon oxide (e.g., an ALD layer) having an etch selectivity with respect to the first type of silicon oxide. Alternatively, the molding layers 105 may each be formed of an insulating oxide (e.g., silicon oxide), while the buffer layer 120 is formed of an insulating nitride (e.g., silicon nitride, aluminum nitride, or hafnium nitride) having an etch selectivity with respect to the insulating oxide. As still another alternative, the molding layer 105 may be formed of silicon oxide, while the buffer layer 120 is formed of silicon oxynitride (SiON).

The data storage layer 125 may be formed of material that can store data in a nonvolatile memory device. For example, the data storage layer 125 is formed of a TMO, such as of at least one material selected from the group consisting of TiO, TaO, NiO, ZrO, and HfO. Alternatively, the data storage layer 125 may be formed of material, e.g., phase-change material, that can store data in a PRAM. In this respect, reference may be made to the examples of phase-change material provided above.

As was also already described, the electrode layer 130 may be formed of at least one material selected from the group consisting of Ru, W, Ti, TiN, TiAlN, TiSi, TiSiN, Ta, TaN, Hf, and Zr. However, the inventive concept is not so limited. For instance, the electrode layer 130 may comprise a poly-Si layer.

Also, in one example of this embodiment, the core layer 135 is omitted and the electrode layer 130 fills what remains of the opening 115 after the data storage layer 125 is formed. In other illustrated example, however, the electrode layer 130 is formed of a conductive material layer, while the core layer 135 is formed of insulating material. For example, the core layer 135 is formed of silicon oxide and/or silicon nitride.

In still another example of this embodiment, the electrode layer 130 and the core layer 135 are formed of different conductive materials. For example, the electrode layer 130 may be formed as a noble metal layer or a metal nitride layer, while the core layer 135 is formed as a metal layer such as a tungsten (W) layer.

Figure 5D:
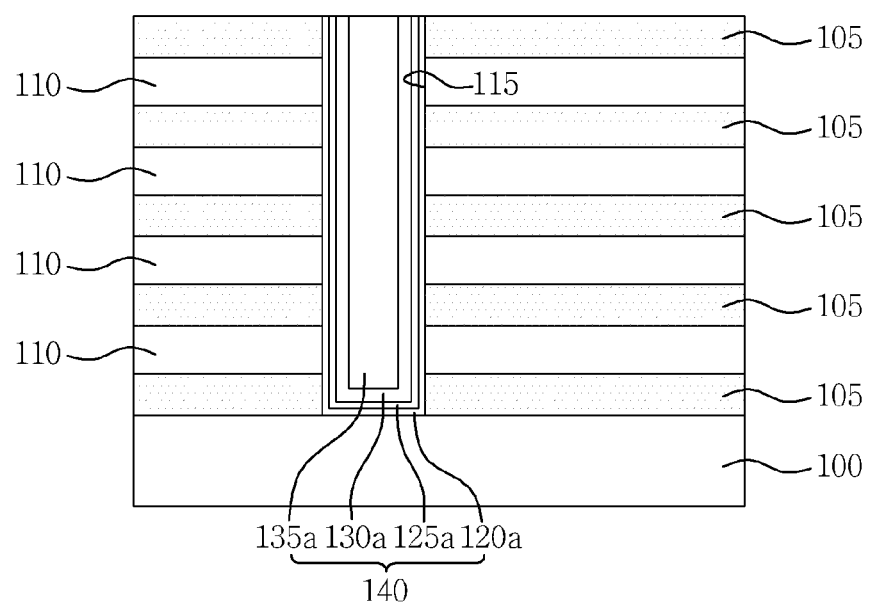

Referring to FIG. 5D, the core layer 135, the electrode layer 130, the data storage layer 125, and the buffer layer 120 are sequentially planarized until an uppermost one of the horizontal layers 105 and 110 is exposed. The planarization process may be a chemical mechanical polishing (CMP) process and/or an etchback process. As a result, a core pattern 135a, a vertical electrode pattern 130a, a data storage pattern 125a, and a preliminary buffer pattern 120a are formed, and together constitute a preliminary vertical structure 140 filling the opening 115. In this structure 140, the core pattern 135a has the form of a pillar, the vertical electrode pattern 130a surrounds the core pattern 135a, the data storage pattern 125a surrounds the vertical electrode pattern 130a, and the preliminary buffer pattern 120a surrounds the data storage pattern 125a.

Figure 5E:
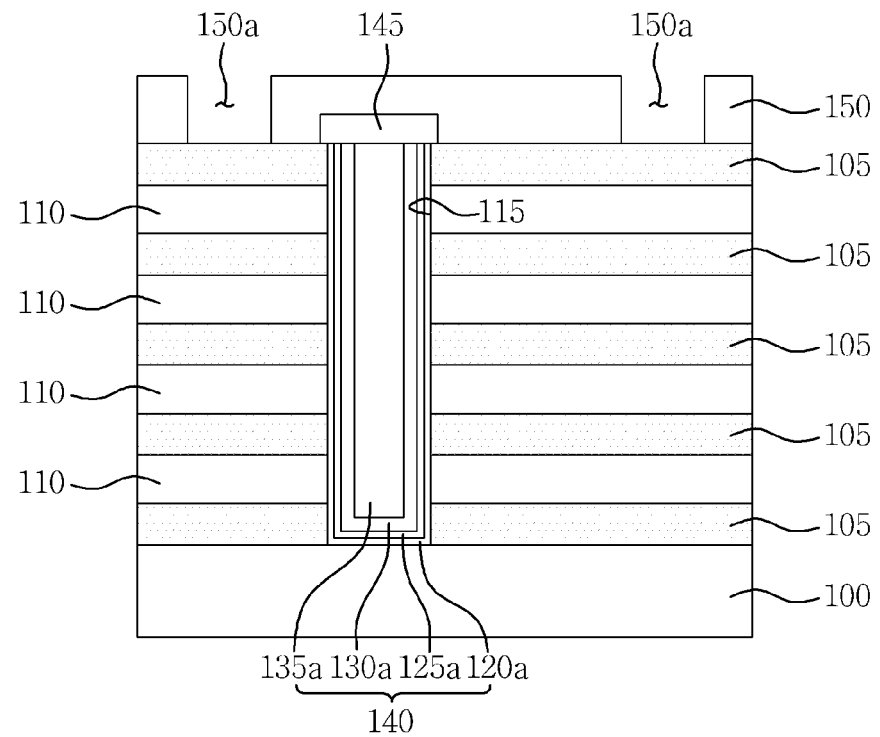

Referring to FIG. 5E, a pad 145 of conductive material is formed on the preliminary vertical structure 140 as electrically connected to the vertical electrode pattern 130a. The conductive material of the pad 145 may be at least one material selected from the group consisting of Ru, W, WN, Ti, TiN, TiAlN, TiSi, TiSiN, Ta, TaN, Hf, and Zr. Also, the pad 145 may be formed to cover the entire top surface of the preliminary vertical structure 140. In any case, the pad 145 may be formed by a thin-film forming process and a patterning process, i.e., by forming a thin film of the conductive material on the uppermost one of the layers 105 and 110, and then etching the film.

Next, a capping pattern 150 having an opening 150a therethrough is formed on the substrate 100 to cover the pad 145. The capping pattern 150 is formed of insulating material. The insulating material may have an etch selectivity with respect to the sacrificial patterns 110a. For example, when the sacrificial patterns 110a are formed of silicon nitride or a silicon-based material, the capping pattern 150 can be formed of silicon oxide.

Figure 5F:
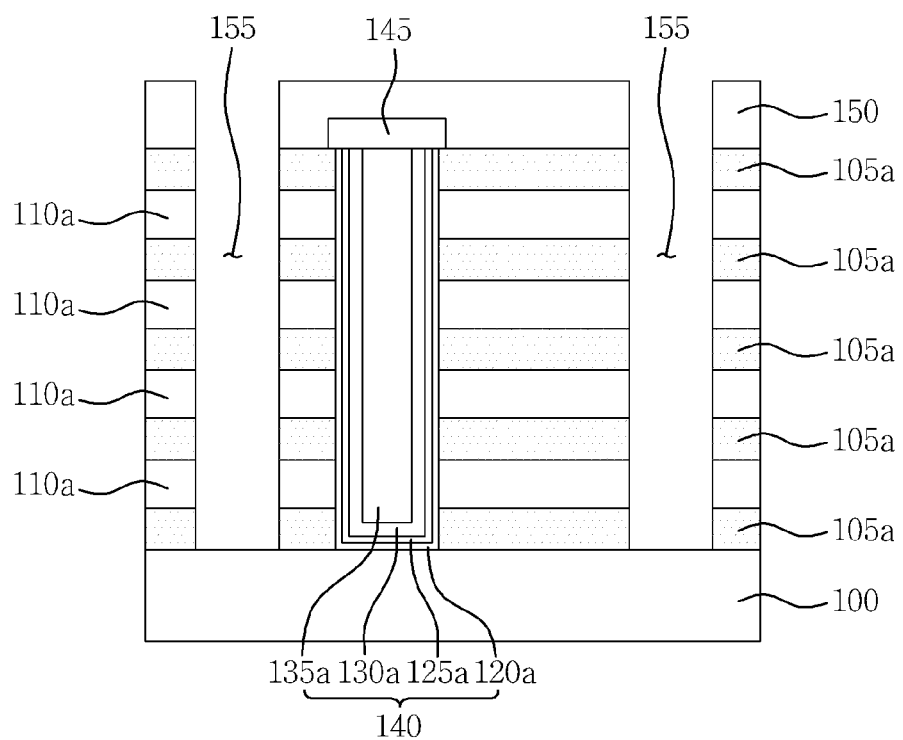

Referring to FIG. 5F, the horizontal layers 105 and 110 disposed under the capping pattern 150 are patterned to thereby form trenches 155 that extend through the horizontal layers 105 and 110. As a result, molding patterns 105a and sacrificial patterns 110a are formed. Lateral surfaces of the sacrificial patterns 110a are exposed by the trenches 155.

Figure 5G:
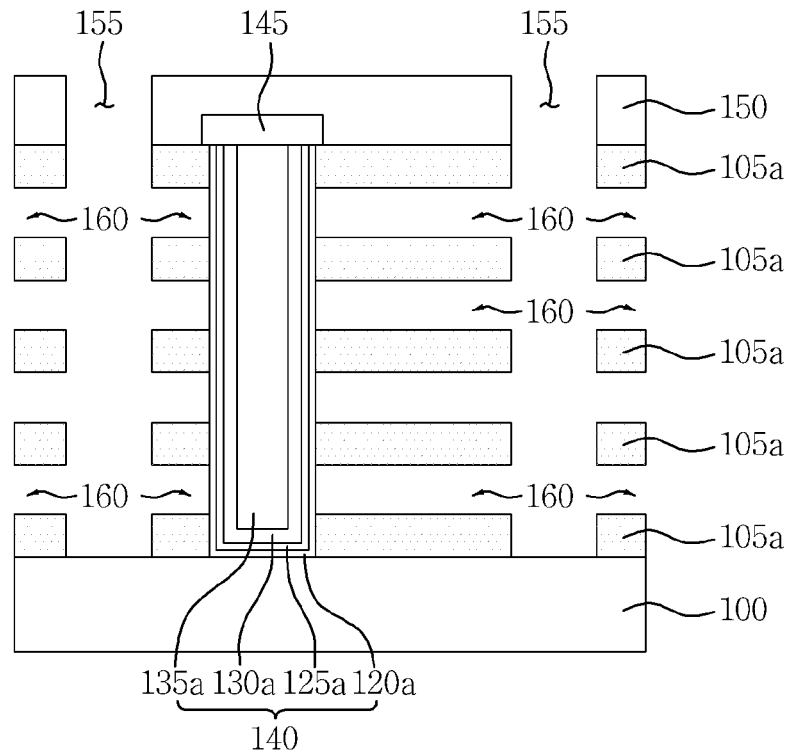

Referring to FIG. 5G, the sacrificial patterns 110a may are selectively removed, thereby forming vacant regions 160. In this respect, the sacrificial patterns 110a may be removed by an etching process. For example, the sacrificial patterns 110a may be removed by an isotropic etching process. When the sacrificial patterns 110a are silicon nitride layers, the sacrificial patterns 110 may be removed by a wet etching process using a wet etchant such as phosphoric acid ($H_3PO_4$). The vacant regions 160 expose top and bottom surfaces of the preliminary buffer patterns 120a.

As was mentioned above, the preliminary buffer layer 120 is formed of a material layer having an etch selectivity with respect to the sacrificial layers 110. Thus, while the sacrificial patterns 110a are being removed using an isotropic etching process, the preliminary buffer pattern 120a can prevent the data storage pattern 125a from being damaged due to the etching process. That is, the preliminary buffer pattern 120a may protect the data storage pattern 125a from the isotropic etching process used to remove the sacrificial patterns 110a. This means that an over-etching process can be used to assure that the sacrificial patterns 110a are completely removed.

Figure 5H:
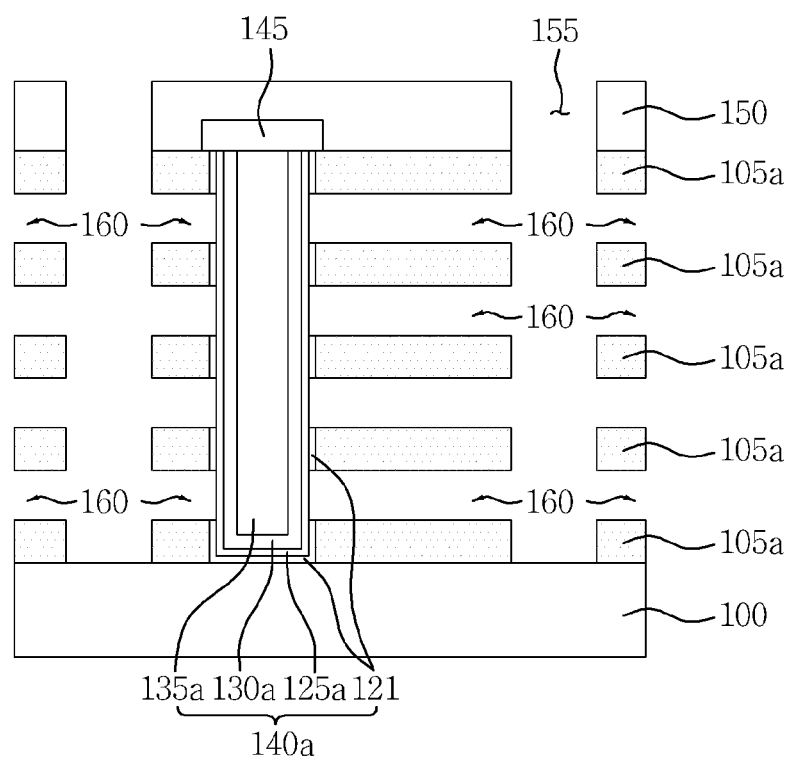

Referring to FIG. 5H, the preliminary buffer pattern 120a is then etched to thereby expose the data storage pattern 125a. More specifically, the portions of the preliminary buffer pattern 120a exposed by the vacant regions 160 are etched to thereby expose portions of the data storage pattern 125a. Meanwhile, the removed portion of the preliminary buffer pattern 120a has a much smaller volume than the volume of the sacrificial patterns 110a that were removed. Accordingly, this characteristic of the method also is responsible for the fact that the data storage pattern 125a will not sustain any etching damage during the etching of the preliminary buffer pattern 120a, or enough etching damage, as to affect the characteristics of the memory device.

The remnants of the preliminary buffer pattern 120a left between the molding patterns 105a and the data storage pattern 125a constitute buffer patterns 121. Accordingly, a vertical structure 140a including the buffer patterns 121, the data storage pattern 125a, the vertical electrode pattern 130a, and the core pattern 135a is formed.

Figure 5I:
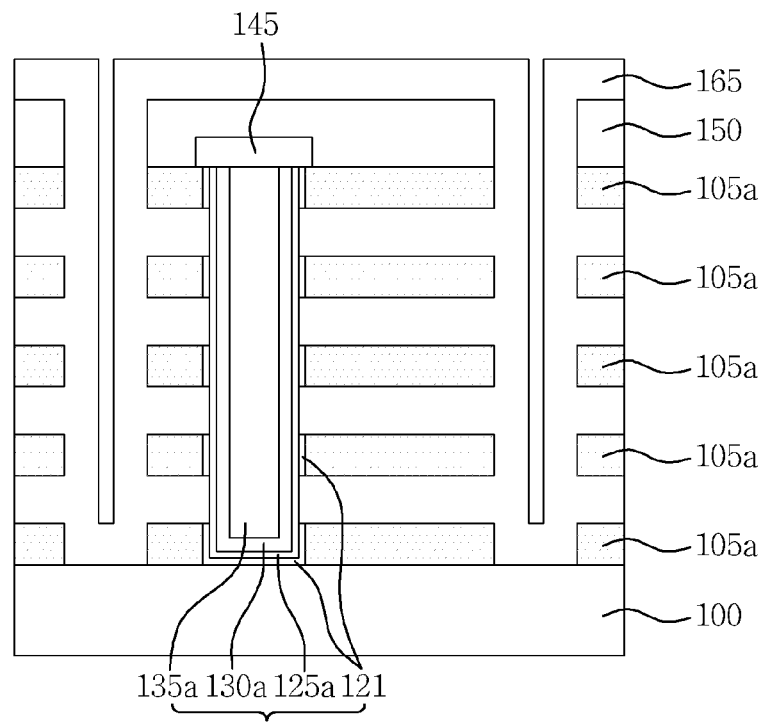

Referring to FIG. 5I, a conductive layer 165 is then formed on the substrate 100 to fill the vacant regions 160 that expose parts of the data storage pattern 125a. The conductive layer 165 may also extend along the sides of the trenches 155. The conductive layer 165 may be formed of at least one of a metal, a metal nitride, a silicide, and poly-Si. For instance, the conductive layer 165 may be formed of at least one material selected from the group consisting of Ru, W, WN, Ti, TiN, TiAlN, TiSi, TiSiN, Ta, TaN, Hf, and Zr or of poly-Si.

Figure 5J:
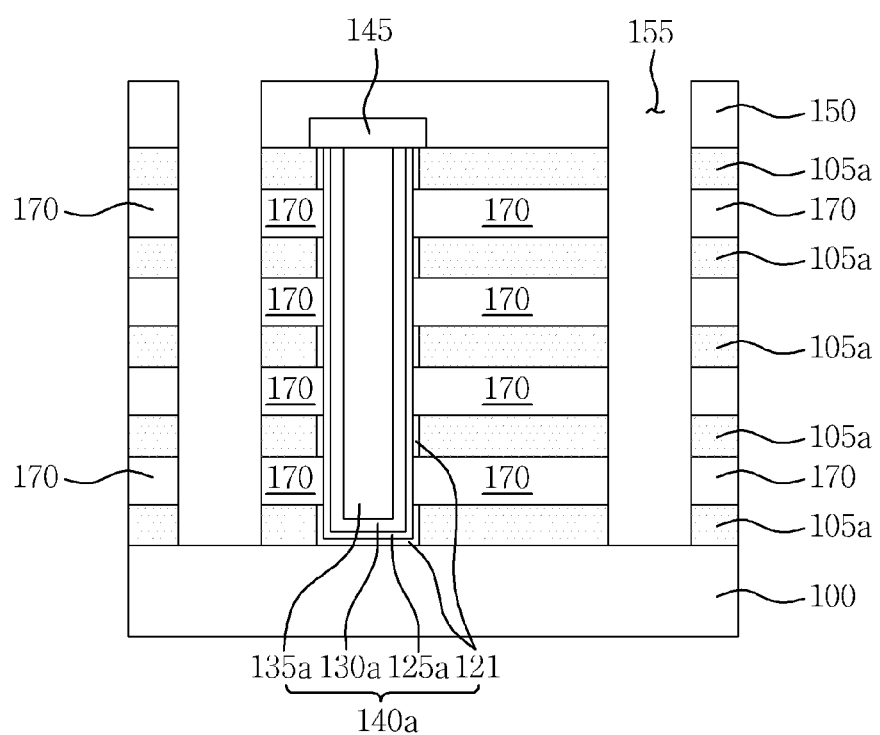

Referring to FIG. 5J, the conductive layer 165 is trimmed. More specifically, part of the conductive layer 165 is removed while another part thereof is left within the vacant regions 160. The trimming of the conductive layer may be effected by an etching process. The parts of the conductive layer 165 left in the vacant regions 160 constitute horizontal electrode patterns 170.

Figure 5K:
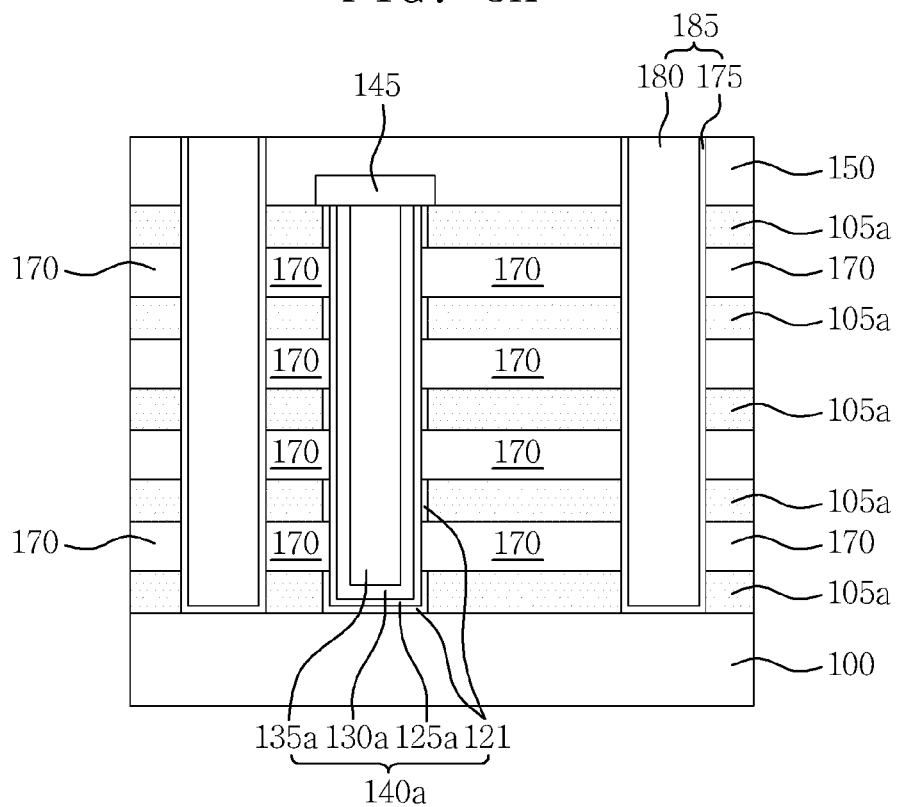

Referring to FIG. 5K, insulating material is then formed on the substrate 100 and planarized, thereby forming isolation patterns 185 filling the trenches 155. In the illustrated example, the isolation patterns 185 may be formed by conformally forming a first isolation layer 175 to a substantially uniform thickness on the substrate 100, then forming a second isolation layer 180 on the first isolation layer 175 and to such a thickness as to fill what remains of the trenches 155, and then planarizing the layers 175 and 180. The first isolation layer 175 may comprise a silicon nitride layer, while the second isolation pattern 180 may comprise a silicon oxide layer. Thus, the isolation patterns 185 may comprise at least a silicon oxide layer left within the trenches 155.

Figure 4:
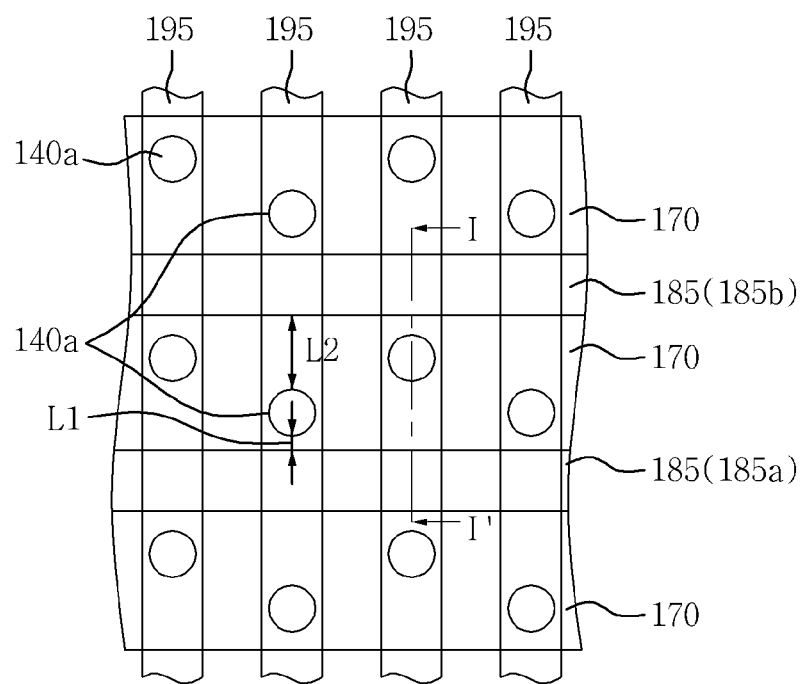
FIG. 4 is a plan view of a semiconductor device according to the inventive concept.

Referring now to FIGS. 4 and 5K, in the method described above, each of the horizontal electrode patterns 170 winds up interposed between a pair of the isolation patterns 185. That is, when the device is viewed in plan, a first isolation pattern 185a and a second isolation pattern 185b are disposed opposite each other with the horizontal patterns 105a and 170 interposed therebetween. Also, each vertical structure 140a interposed between the first and second isolation patterns 185a and 185b may be spaced a first distance L1 from the first isolation pattern 185a and a second distance L2, greater than the first distance L1, from the second isolation pattern 185b.

Figure 5L:
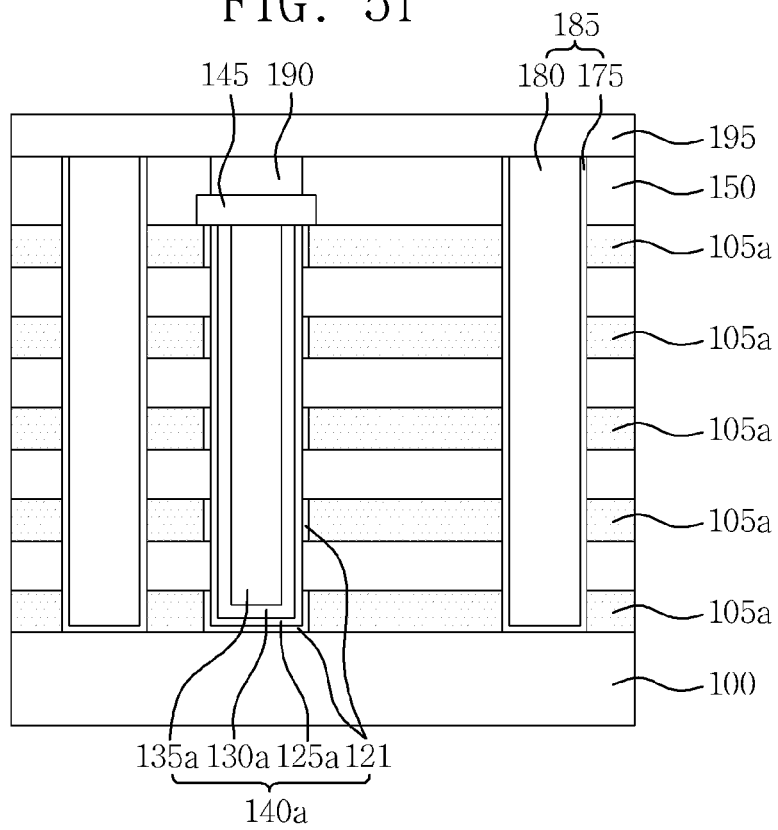

Referring to FIG. 5L, a contact plug 190 is then formed through the capping pattern 150 and electrically connected to the pad 145. The contact plug 190 is a conductive layer of material, comprising a metal nitride layer or a metal layer, for example. For example, the contact plug 190 may comprise a Ti layer, a TiN layer, or a W layer.

Next, a conductive line 195 is formed on the capping pattern 150 to cover the contact plug 190. The conductive line 195 may be formed of a metal nitride or simply of a metal. For example, the conductive line 195 may be formed of Ti, TiN, or W.

The above-described components may constitute a nonvolatile memory device. In this case, the data storage pattern 125a serves to store data of the nonvolatile memory device, each of the horizontal electrode patterns 170 serves as word lines of the nonvolatile memory device, and the conductive line 195 serves as a bit line. As shown in FIG. 4, the word lines and the bit line may cross each other. Furthermore, a portion of the horizontal electrode patterns 170 adjacent the data storage pattern 125a may serve as a first electrode, while the vertical electrode pattern 130a serves as a second electrode.

Another example of the first embodiment of the method of fabricating a semiconductor device according to the inventive concept will now be described with reference to FIGS. 6A and 6B. In this regard, primarily only the steps, processes, etc. of this example which differs from that described with reference to FIGS. 5A through 5L will be described in detail.

First, those steps, processes, etc. described with reference to FIGS. 5A through 5H are performed. Accordingly, a structure which has vacant regions 160 exposing parts of a data storage pattern 125a is prepared.

Figure 6A:
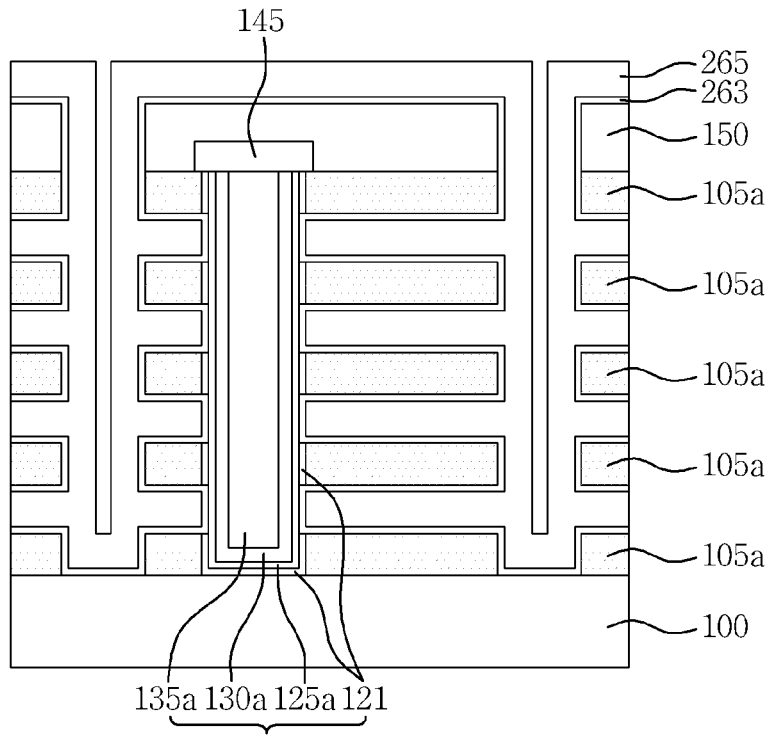
FIGS. 6A and 6B are cross-sectional views for illustrating another example of the first embodiment of a method of fabricating a semiconductor device according to the inventive concept.

Subsequently, as shown in FIG. 6A, an additional layer 263 is formed on the structure. The additional layer 263 is formed to a substantially uniform thickness over at least inner wall surfaces that delimit the vacant regions 160 but not so much as to fill the vacant regions 160. The additional layer 263 may be of the same material as the additional pattern 7a described with reference to FIG. 1C.

Subsequently, a conductive layer 265 is formed on the additional layer 263 to fill what remains of the vacant regions 160. The conductive layer 265 may be formed of at least one of a metal, a metal nitride, a silicide, and a poly-Si layer. For example, the conductive layer 265 may be formed of at least one material selected from the group consisting of Ru, W, WN, Ti, TiN, TiAlN, TiSi, TiSiN, Ta, TaN, Hf, and Zr or of poly-Si.

Figure 6B:
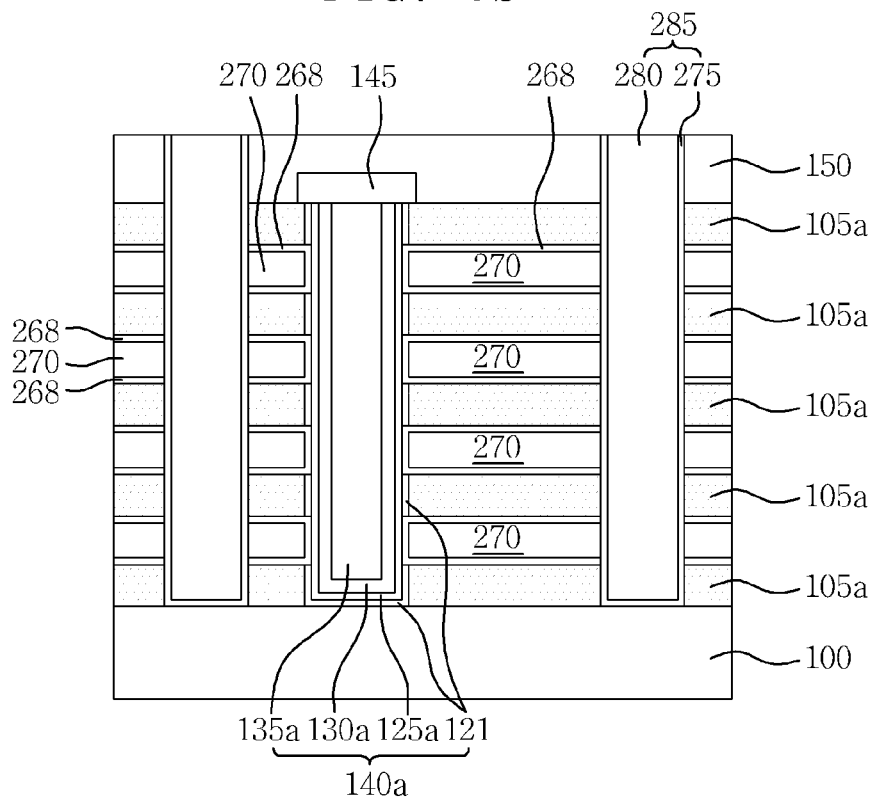

Referring to FIG. 6B, the conductive layer 265 and the additional layer 263 are trimmed (by an etching process) such that portions of the conductive layer 265 and the additional layer 263 are left within the vacant regions 160. These remnants of the additional layer and the conductive layer left within the vacant regions 160 constitute additional patterns 268 and horizontal electrode patterns 270, respectively.

Subsequently, as described with reference to FIG. 5K, insulating material is formed on the substrate and planarized, thereby forming isolation patterns 285 filling trenches 155. Also, as described with reference to FIG. 5K, the isolation patterns 285 may include a substantially uniformly thick and conformal first isolation layer 275 lining the trenches 255, and a second isolation layer 280 disposed on the first isolation pattern 275.

Hereinafter, a second embodiment of a method of fabricating a semiconductor device according to the inventive concept will be described with reference to FIGS. 7A and 7B. Again, primarily only the differences between this embodiment and the first embodiment shown in FIGS. 5A-5L will be described in detail.

First, the steps, processes, etc. described with reference to FIGS. 5A through 5H are performed. Thus, as shown FIG. 7A, a data storage pattern 325a, a vertical electrode pattern 330a, and a core pattern 335a corresponding, respectively, to the data storage pattern 125a, the vertical electrode pattern 130a, and the core pattern 135a, are formed. Also, the process described with reference to FIG. 5G is performed to form vacant regions 160.

Figure 7A:
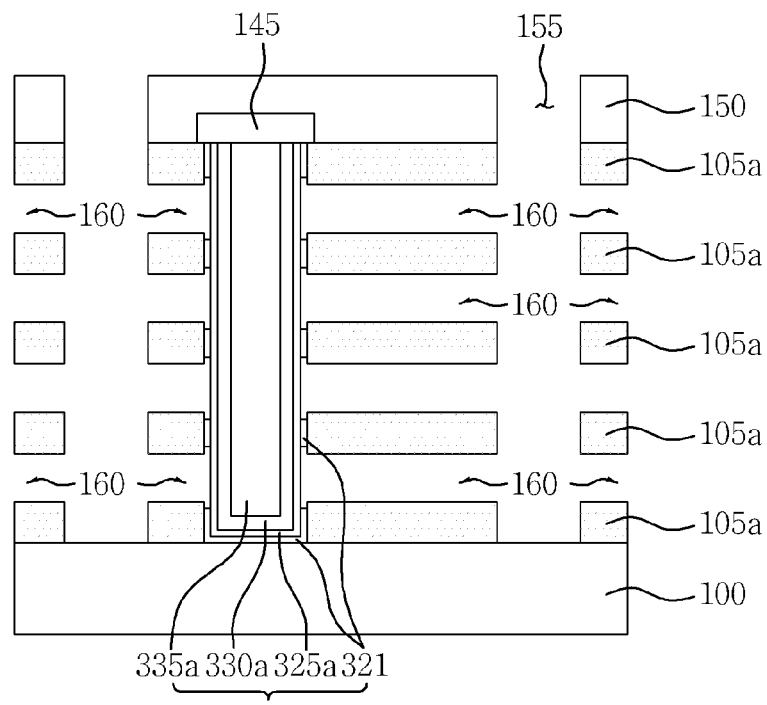
FIGS. 7A and 7B are cross-sectional views for illustrating a second embodiment of a method of fabricating a semiconductor device according to the inventive concept.

Subsequently, as is also shown in FIG. 7A, a buffer layer exposed by the vacant regions 160 is etched to form undercut regions between the molding patterns 105a and the data storage pattern 325a. As a result, buffer patterns 321 are formed between the molding patterns 105a and the data storage pattern 325a. Thus, a vertical structure 340a including the buffer patterns 321, the data storage pattern 325a, the vertical electrode pattern 330a, and the core pattern 335a is formed. In this respect, the vertical structure 340a is substantially the same as the vertical structure 59 shown in and described with reference to FIG. 2A.

Figure 7B:
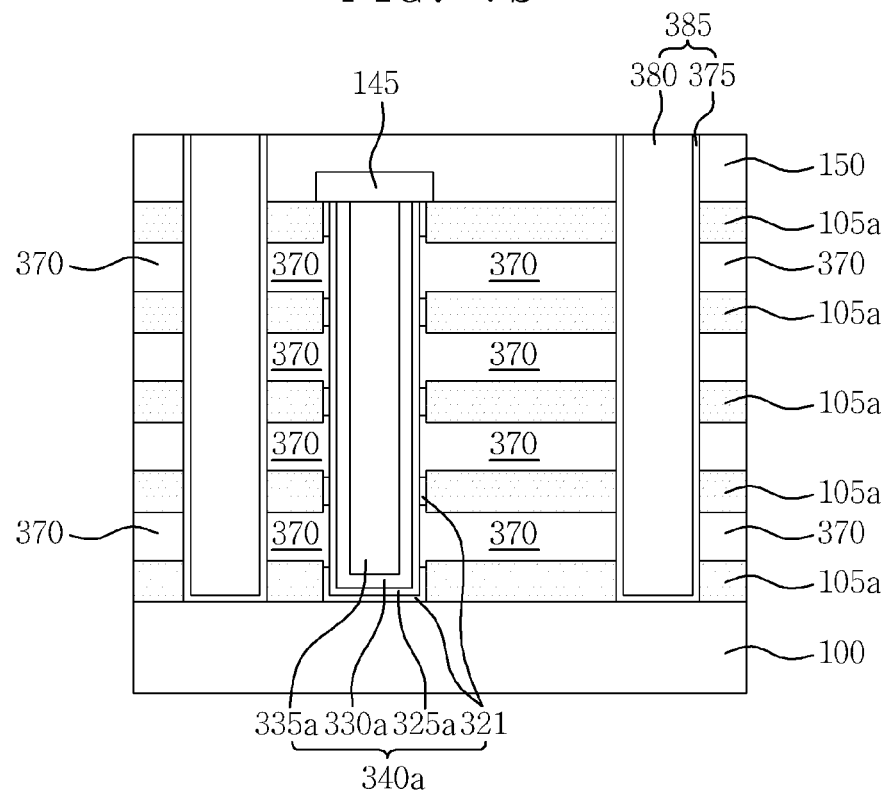

Referring to FIG. 7B, horizontal electrode patterns 370 filling the vacant regions 160 are formed as described with reference to FIGS. 5I through 5J. Subsequently, as described with reference to FIG. 5K, insulating material is formed on the substrate and planarized to thereby form isolation patterns 385 that fill the trenches 155. The isolation patterns 385 may include a first isolation layer 375 and a second isolation layer 380 disposed on the first isolation layer 375.

Another example of the second embodiment of a method of fabricating a semiconductor device according to the inventive concept will now be described with reference to FIG. 8.

First, a structure a shown in FIG. 7A is formed by the steps shown in and described with reference to FIGS. 5A through 5H. That is, a structure having vacant regions 160 exposing portions of a data storage pattern 325a is formed.

Subsequently, as described with reference to FIGS. 6A and 6B, an additional layer is conformally formed on the substrate to line the vacant regions, and a conductive layer is formed on the additional layer to fill what remains of the vacant regions 160, and the conductive layer and the additional layer are trimmed. As a result, additional patterns 468 and horizontal electrode patterns 470 are formed within the vacant regions 160.

Next, as described with reference to FIG. 7B, insulating material is formed on the substrate and planarized, thereby forming isolation patterns 385 filling the trenches 155.

A third embodiment of a method of fabricating a semiconductor device according to the inventive concept will now be described with reference to FIGS. 9A and 9B. Needless to say, primarily only the differences between this embodiment and those described above will be described in detail.

First, a structure is formed using the steps, processes, etc. described with reference to FIGS. 5A through 5H. Therefore, as shown in FIG. 9A, a data storage pattern 525a, a vertical electrode pattern 530a, and a core pattern 535a corresponding, respectively, to the data storage pattern 125a, the vertical electrode pattern 130a, and the core pattern 135a, are formed. Also, sacrificial patterns 110a are selectively removed from the structure as described with reference to FIG. 5G to form the vacant regions 160 exposing the preliminary buffer pattern 120a.

Next, as described with reference to FIG. 5H, portions of the preliminary buffer pattern 120a are removed by an etching process to expose the data storage pattern 525a. The remaining portions of the preliminary buffer pattern 120a constitute buffer patterns 521. Thus, a vertical structure 540a including the buffer patterns 521, the data storage pattern 525a, the vertical electrode pattern 530a, and the core pattern 535a is formed.

Subsequently, the thickness of the molding patterns is reduced. For instance, the molding patterns 105a may be isotropically etched. As a result, thinner molding patterns 505a are formed. Accordingly, the distance between vertically adjacent molding patterns is increased (from D1 to D2 in the figure).

Meanwhile, the thickness of the capping pattern is also reduced during the etching process for reducing the thickness of the molding patterns. Thus, a thinner capping pattern 550 is formed. At this time, however, the data storage pattern 525a is not etched due to an etch selectivity between the material of the molding patterns 105a and the material of the data storage pattern 525a. In any case, a vertical structure 540a that is substantially the same as the vertical structure 89 shown in and described with reference to FIG. 3A is formed.

Figure 9B:
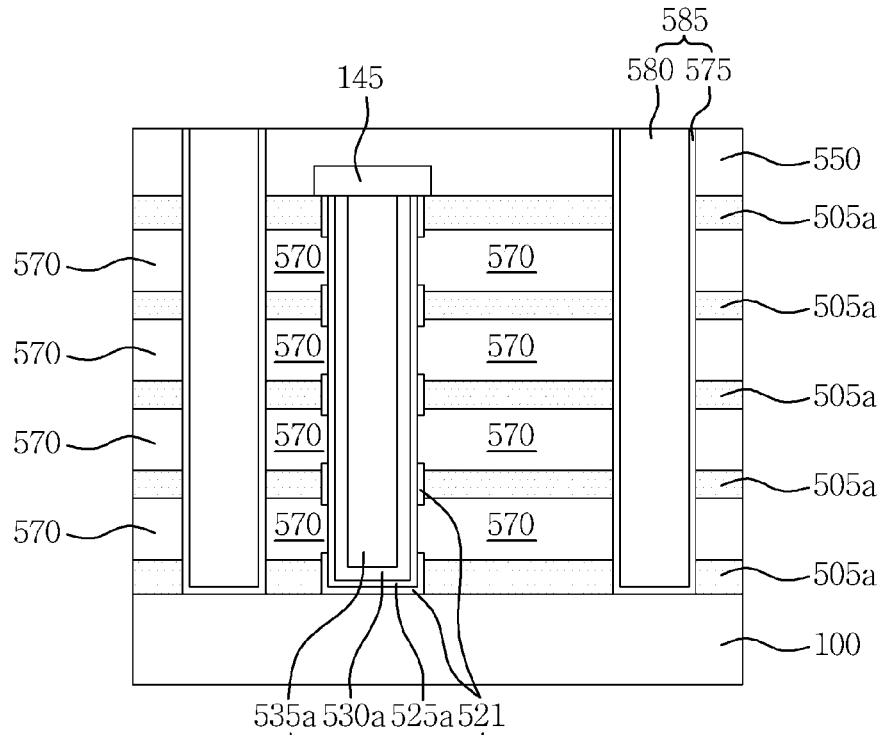

Referring to FIG. 9B, horizontal electrode patterns 570 filling the vacant regions 560 are formed as described with reference to FIGS. 5I through 5J. Next, as described with reference to FIG. 5K, insulating material is formed on the substrate and planarized to thereby form isolation patterns 585 filling trenches 155. The isolation patterns 585 may include a first isolation layer 575 and a second isolation layer 580 disposed on the first isolation layer 575.

Figure 10:
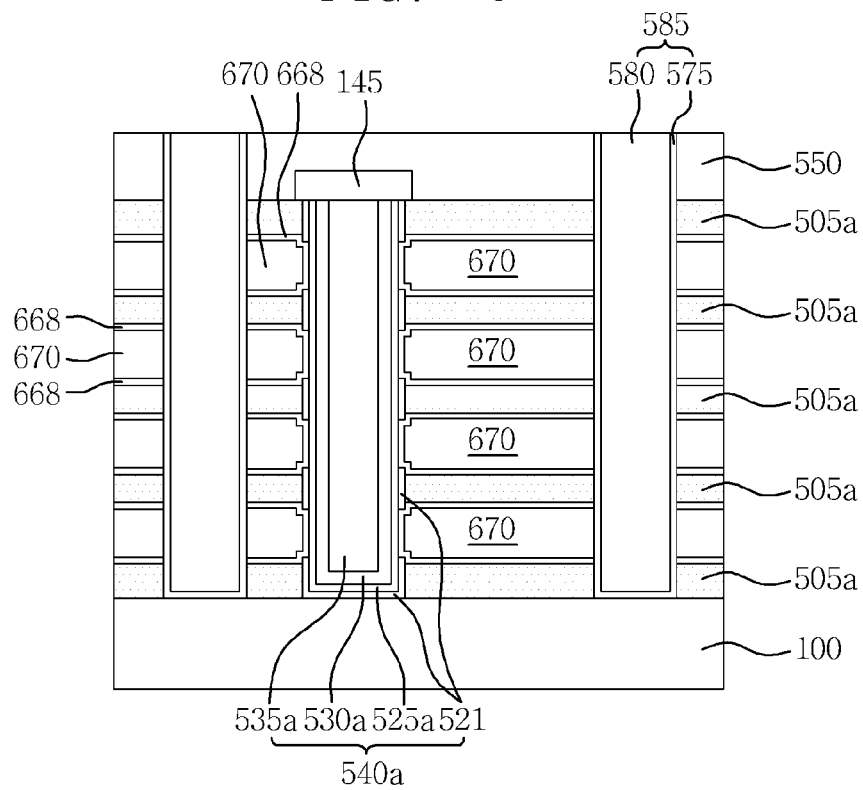
FIG. 10 is a cross-sectional view for illustrating another example of the third embodiment of a method of fabricating a semiconductor device according to the inventive concept.

Another example of the third embodiment of the method of fabricating a semiconductor device according to the inventive concept will now be described with reference to FIG. 10.

First, a structure is formed as described with reference to FIG. 9A. That is, a substrate having vacant regions 560 exposing portions of the data storage pattern 525a is formed. Also, the "thinned" molding patterns 505a are formed.

Next, as described with reference to FIGS. 6A and 6B, an additional layer is conformally formed on the structure to line the vacant regions 560, a conductive layer is formed on the additional layer to fill what remains of the vacant regions 560, and the conductive layer and the additional layer are trimmed. As a result, additional patterns 668 and horizontal electrode patterns 670 are left within the vacant regions 560. Subsequently, as described with reference to FIG. 9B, insulating material is formed on the substrate and planarized, thereby forming isolation patterns 585 filling the trenches 155.

Figure 11:
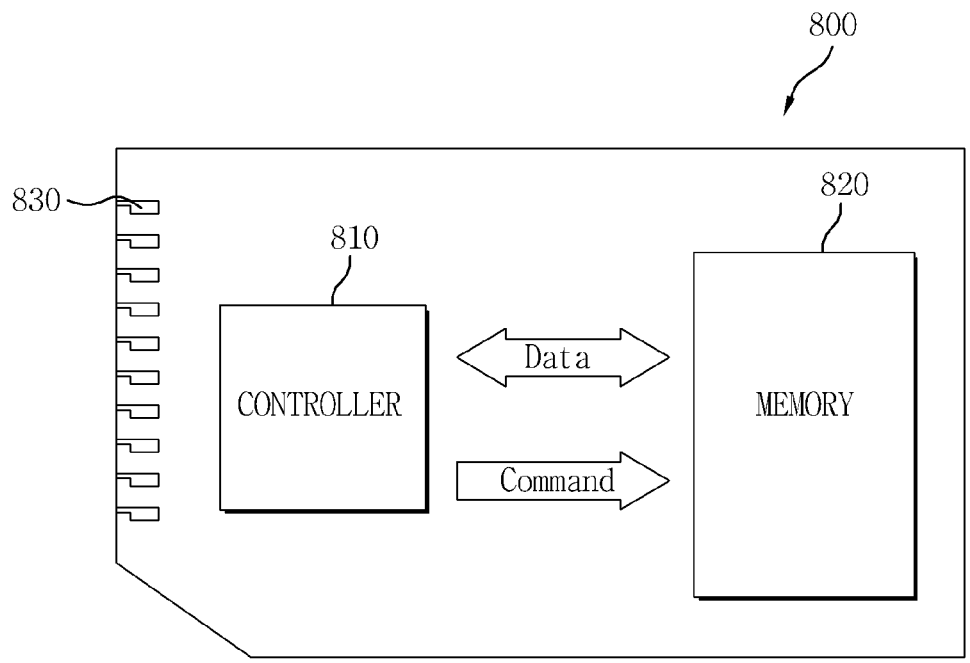
FIG. 11 is a schematic diagram of a memory card according to the inventive concept.

A memory card system 800 including a semiconductor device according to the inventive concept is shown in FIG. 11. The memory card system 800 may be a multimedia card (MMC), a secure digital (SD) card, or the like.

The memory card system 800 includes a controller 810, a memory 820, and an interface 830. The controller 810 and the memory 820 are configured to transmit and receive commands and/or data. The memory 820 is used to store commands executed by the controller 810 and/or user's data. Accordingly, the memory card system 800 can store data in the memory 820 or externally output data from the memory 820. The memory 820 comprises a semiconductor device (e.g., a nonvolatile memory device) according to the inventive concept. The interface 830 is used to externally input and output data.

Figure 12:
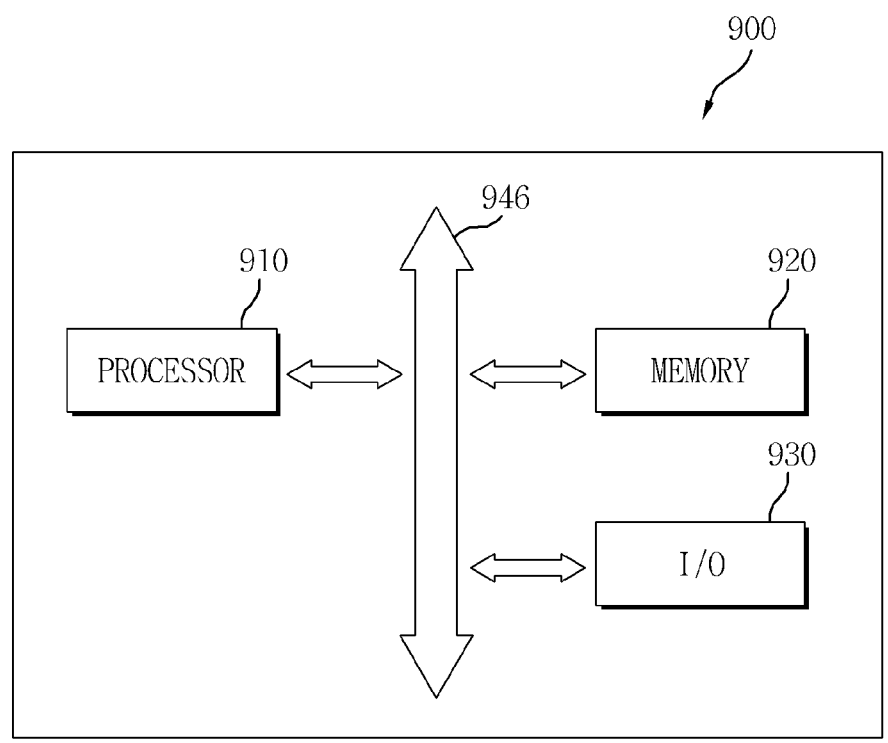
FIG. 12 is a block diagram of an electronic system according to the inventive concept.

An electronic device 900 including a semiconductor device according to the inventive concept is shown in FIG. 12.

The electronic device 900 includes a processor 910, a memory 920, and an I/O device 930. The processor 910, the memory 920, and the I/O device 930 are connected to one another through a bus 946.

The memory 920 receives control signals, such as RAS*, WE*, and CAS*, from the processor 910. The memory 920 stores codes and data for operations of the processor 910. The memory 920 is accessed through the bus 946.

The memory 920 comprises a semiconductor device (e.g., a nonvolatile memory device) according to the inventive concept. The memory 920 will also included additional circuits as required in practice.

The electronic device 900 may be employed by any type of system that requires a memory. For example, the electronic device 900 may be employed by various wired or wireless devices including desktop computers, personal digital assistants (PDA), wireless phones, portable computers such as a laptop computers and web tablets, digital music players such as an MP3 players, navigation systems, solid-state drives (SSD), and even household appliances.

Figure 13:
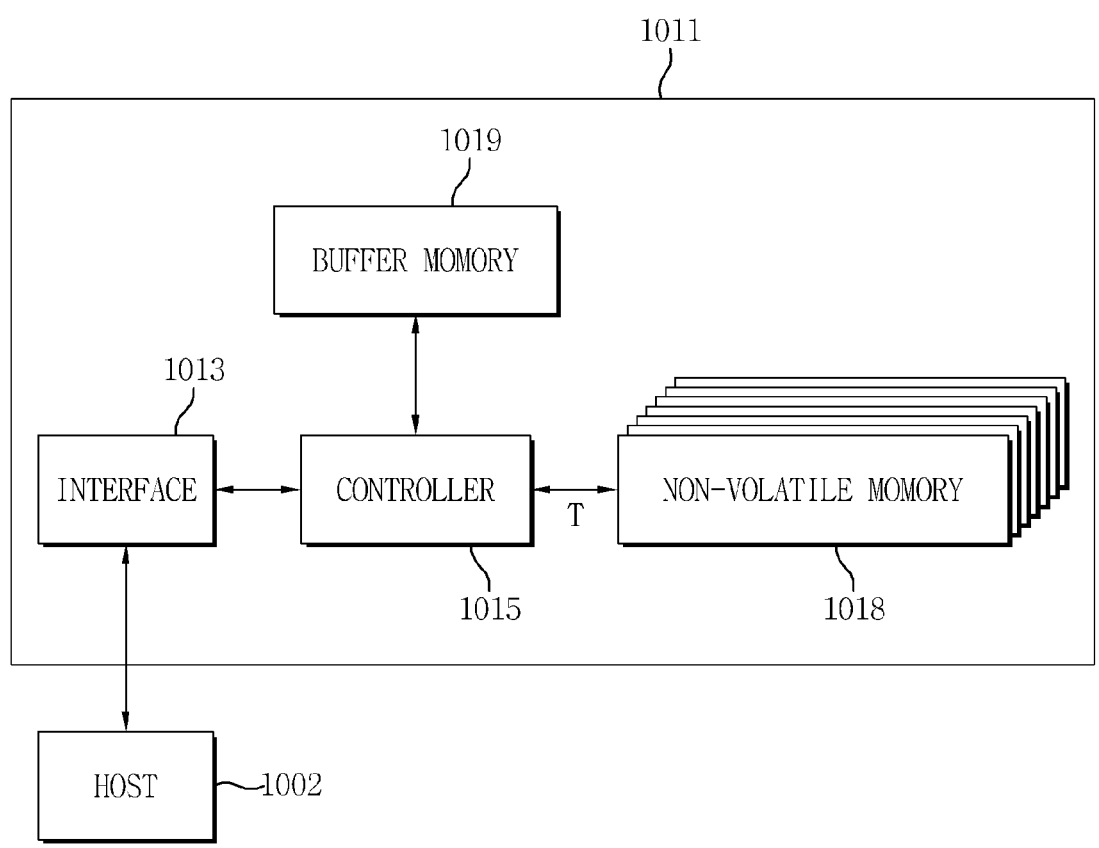
FIG. 13 is a block diagram of a data storage system according to the inventive concept.
Figure 14:
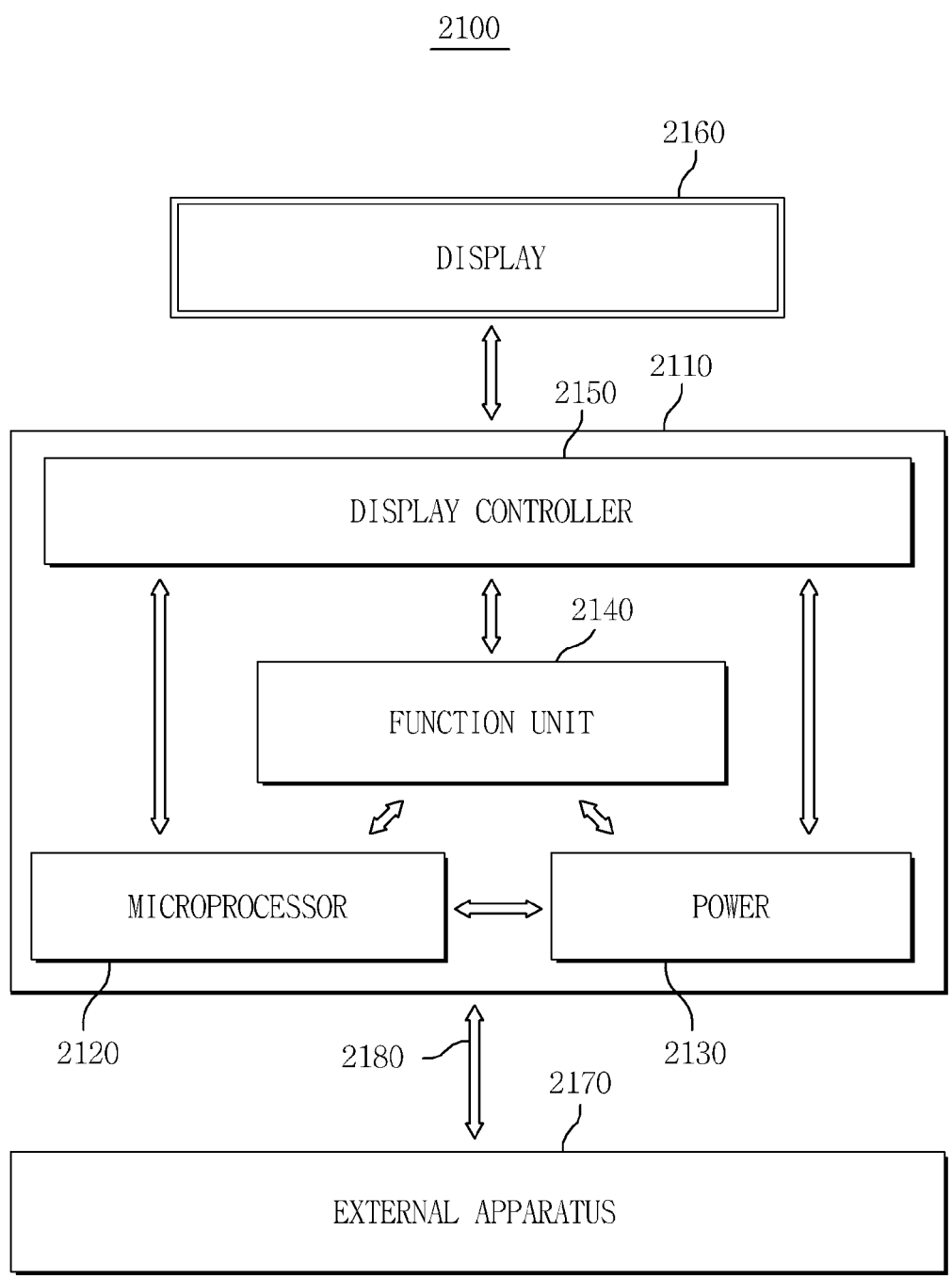
FIG. 14 is a block diagram of an electronic device according to the inventive concept.

More specific examples of an electronic device having a semiconductor device according to the inventive concept are shown in FIGS. 13 and 14.

FIG. 13 shows an SSD 1011. An SSD stores information using a semiconductor device. As compared with hard disk drives (HDDs), SSDs operate at higher speeds with less mechanical delay and failures, generate less heat and noise, and can be made generally smaller in scale and more lightweight for the same data storage capacity. SSDs are widely used in laptop personal computers (laptop PCs), netbooks, desktop PCs, and MP3 players, for example.

The SSD 1011 includes an interface 1013, a controller 1015, a nonvolatile memory 1018, and a buffer memory 1019.

The controller 1015 is disposed adjacent to and is electrically connected to the interface 1013. The controller 1015 in this SSD is a microprocessor (MP) including a memory controller and a buffer controller. The nonvolatile memory 1018 is disposed adjacent to and is electrically connected to the controller 1015 through a connection terminal T. The nonvolatile memory 1018 provides the data storage capacity of the SSD 1011. The buffer memory 1019 is disposed adjacent to and is electrically connected to the controller 1015.

The interface 1013 can be connected to a host 1002 and serves to transmit and receive electronic signals, such as data. To this end, the interface 1013 may employ any one of various standards, such as serial advanced technology attachment (SATA), integrated drive electronics (IDE), small computer system interface (SCSI), and/or a combination thereof. The nonvolatile memory 1018 is connected to the interface 1013 through the controller 1015.

The nonvolatile memory 1018 stores data received through the interface 1013. To this end, the nonvolatile memory 1018 comprises a semiconductor device according to the inventive concept.

Even if power supplied to the SSD 1011 is interrupted, the nonvolatile memory 1018 retains the stored data.

The buffer memory 1019 may include at least one volatile memory device such as a dynamic random access memory (DRAM) and/or a static random access memory (SRAM). The buffer memory 1019 may thus operate at higher speed than the nonvolatile memory device 1018.

The data transmission speed of the interface 1013 is higher than the operating speed of the nonvolatile memory device 1018. Accordingly, the buffer memory 1019 serves to temporarily store data. After data received through the interface 1013 is temporarily stored in the buffer memory 1019 through the controller 1015, the received data is permanently stored in the nonvolatile memory 1018 at a data write speed of the nonvolatile memory 1018. Also, among the data stored in the nonvolatile memory 1018, frequently used data may be read in advance and temporarily stored in the buffer memory 1019. That is, the buffer memory 1019 may function to increase the effective operating speed of the SSD 1011 and reduce an error rate.

Referring to FIG. 14, an electronic system 2100 includes a body 2110, an MP unit 2120, a power unit 2130, a function unit 2140, and a display controller unit 2150. The body 2110 may be a housing or a mother board comprising a printed circuit board (PCB). The MP unit 2120, the power unit 2130, the function unit 2140, and the display controller unit 2150 are mounted to the body 2110. The display unit 2160 may be disposed inside the body 2110 or on the surface of the body 2110. For example, the display unit 2160 may be disposed on the surface of the body 2110 and display an image processed by the display controller unit 2150.

The power unit 2130 receives a predetermined voltage from an external battery (not shown), divides the voltage into voltages of certain levels, and supply the voltages to the MP unit 2120, the function unit 2140, and the display controller unit 2150. The MP unit 2120 receives a voltage from the power unit 2130 and controls the function unit 2140 and the display unit 2160. The function unit 2140 serves various functions of the electronic system 2100. For example, when the electronic system 2100 is a portable phone, the function unit 2140 may output an image to the display unit 2160, output a voice to a speaker, dial an external apparatus 2170, etc. When the phone includes a camera, the function unit 2140 may serve as the image processor of the camera.

In an application in which the electronic system 2100 is connected to a memory card to increase its data storage capacity, the function unit 2140 may be a memory card controller. Also, the function unit 2140 may transmit and receive signals to and from the external apparatus 2170 through a wired or wireless communication unit 2180. Furthermore, when the electronic system 2100 requires a universal serial bus (USB) to increase functionality, the function unit 2140 may serve as an interface controller.

at least one of the MP unit 2120 and the function unit 2140 comprises a semiconductor device according to the embodiments of the inventive concept.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims

What is claimed is:

1. A semiconductor device comprising:
a substrate having an upper surface;
horizontal patterns stacked on the upper surface of the substrate, the horizontal patterns including a first molding pattern, a horizontal electrode pattern disposed on the first molding pattern, and a second molding pattern disposed on the horizontal electrode pattern; and
a vertical structure extending vertically through the horizontal patterns, wherein the vertical structure comprises:
a vertical electrode pattern,
a data storage pattern interposed between the vertical electrode pattern and the horizontal patterns,
a first buffer pattern interposed between the data storage pattern and the first molding pattern, and
a second buffer pattern interposed between the data storage pattern and the second molding pattern and spaced apart from the first buffer pattern.

2. The device of claim 1, wherein the data storage pattern has a lateral surface extending around the vertical electrode pattern, the first buffer pattern surrounds a first portion of the lateral surface of the data storage pattern, the second buffer pattern surrounds a second portion of the lateral surface of the data storage pattern, and the first and second portions are spaced apart from each other.

3. The device of claim 2, wherein the horizontal electrode pattern surrounds a third portion of the lateral surface of the data storage pattern, and the third portion is interposed between the first and second portions.

4. The device of claim 1, wherein each of the first and second molding patterns is constituted by a first layer of insulating material, and each of the first and second buffer patterns is constituted by a second layer of insulating material.

5. The device of claim 1, wherein each of the first and second molding patterns comprises a first insulating oxide, and each of the first and second buffer patterns comprises a second insulating oxide having an etch selectivity with respect to the first insulating oxide.

6. The device of claim 1, wherein each of the first and second molding patterns comprises an insulating oxide, and each of the first and second buffer patterns comprises an insulating nitride.

7. The device of claim 1, wherein the second molding pattern is spaced a first distance from the first molding pattern, the second buffer pattern is spaced a second distance from the first buffer pattern, and the second distance is different from the first distance.

8. The device of claim 1, wherein the thickness of the second molding pattern, equal to the dimension of the second molding pattern in a vertical direction perpendicular to that of the upper surface of the substrate, is different from that of the second buffer pattern.

9. The device of claim 1, wherein the horizontal electrode pattern has a first portion and a second portion, the first portion of the horizontal electrode pattern is interposed between the first and second molding patterns, and the second portion of the horizontal electrode pattern is interposed between the first and second buffer patterns.

10. The device of claim 9, wherein thickness of the first portion of horizontal electrode pattern, equal to the dimension of the second molding pattern in a vertical direction perpendicular to that of the upper surface of the substrate, is different from that of the second portion of the horizontal electrode pattern.

11. The device of claim 1, wherein the data storage pattern includes a first portion extending laterally around the vertical electrode pattern and a second portion extending from the first portion over the bottom of the vertical electrode pattern.

12. A semiconductor device comprising:
a substrate having an upper surface;
horizontal patterns stacked on the upper surface of the substrate, the horizontal patterns including a first horizontal electrode pattern, a molding pattern disposed on the first horizontal electrode pattern, and a second horizontal electrode pattern disposed on the molding pattern; and
a vertical structure extending vertically through the horizontal patterns, wherein the vertical structure comprises:
a vertical electrode pattern having a lateral surface,
a data storage pattern interposed between the vertical electrode pattern and the horizontal patterns and extending along the lateral surface of the vertical electrode pattern, and
a buffer pattern interposed between the data storage pattern and the molding pattern, wherein the buffer pattern is disposed at a level above the upper surface of the substrate different than the levels at which the first and second horizontal electrode patterns are disposed above the upper surface of the substrate.

13. The device of claim 12, wherein the data storage pattern comprises:
a first variable resistance region interposed between the first horizontal electrode pattern and the vertical electrode pattern,
a second variable resistance region interposed between the second horizontal electrode pattern and the vertical electrode pattern, and
a fixed resistance region interposed between the buffer pattern and the vertical electrode pattern,
wherein the fixed resistance region is interposed between the first and second variable resistance regions.

14. The device of claim 12, further comprising first and second isolation patterns disposed opposite each other on the upper surface of the substrate, and wherein the horizontal patterns are interposed between the first and second isolation patterns.

15. The device of claim 14, wherein the vertical structure is spaced a first distance apart from the first isolation pattern and is spaced a second distance apart from the second isolation pattern, and the second distance is greater than the first distance.

16. A semiconductor device, comprising:
a substrate having an upper surface;
horizontal layers stacked on the upper surface of the substrate, the horizontal layers including horizontal electrode layers spaced one above the other on a substrate; and
a vertical structure extending vertically through the horizontal layers, wherein the vertical structure comprises:
a vertical electrode,
a data storage layer extending around the vertical electrode, and
vertically spaced apart segments of a buffer layer interposed between the data storage layer and each of the horizontal electrode layers, respectively, wherein the segments of the buffer layer are of material comprising silicon oxide, insulating nitride or silicon oxynitride (SiON).

17. The device of claim 16, wherein the data storage layer is of variable resistance material whose resistance varies with changes in current flowing therethrough.

18. The device of claim 17, wherein the variable resistance material comprises a transition metal oxide (TMO).

19. The device of claim 16, wherein the data storage layer is of phase-change material whose states change between crystalline and amorphous with changes in the temperature thereof.

20. The device of claim 19, wherein the phase change material is of at least one material selected from the group consisting of tellurium (Te), selenium (Se), Ge, antimony (Sb), bismuth (Bi), lead (Pb), tin (Sn), silver (Ag), arsenic (As), sulfur (S), silicon (Si), phosphorus (P), oxygen (O), and carbon (C).

* * * * *